(12) United States Patent
Dwilinski et al.

(10) Patent No.: US 7,750,355 B2
(45) Date of Patent: Jul. 6, 2010

(54) LIGHT EMITTING ELEMENT STRUCTURE USING NITRIDE BULK SINGLE CRYSTAL LAYER

(75) Inventors: Robert Dwilinski, Warsaw (PL); Roman Doradzinski, Warsaw (PL); Jerzy Garczynski, Lomianki (PL); Leszek Sierzputowski, Union City, NJ (US); Yasuo Kanbara, Anan (JP)

(73) Assignees: AMMONO Sp. z o.o., Warsaw (PL); Nichia Corporation, Anan-shi (JP)

( * ) Notice: Subject to any disclaimer, the term of this patent is extended or adjusted under 35 U.S.C. 154(b) by 0 days.

(21) Appl. No.: 10/493,594

(22) PCT Filed: Oct. 28, 2002

(86) PCT No.: PCT/IB02/04441

§ 371 (c)(1),
(2), (4) Date: Apr. 26, 2004

(87) PCT Pub. No.: WO03/043150

PCT Pub. Date: May 22, 2003

(65) Prior Publication Data

US 2004/0251471 A1 Dec. 16, 2004

(30) Foreign Application Priority Data

Oct. 26, 2001 (PL) .................................... 350375
Jun. 26, 2002 (PL) .................................... 354739

(51) Int. Cl.
*H01L 33/00* (2010.01)
(52) U.S. Cl. ............... 257/96; 257/103; 257/E33.033; 257/E33.034; 372/43.01; 372/44.011
(58) Field of Classification Search ............... 257/96, 257/103, E33.033, E33.034; 372/43.01, 372/44.011, 49.01
See application file for complete search history.

(56) References Cited

U.S. PATENT DOCUMENTS 5,096,860 A 3/1992 Nadkarni (Continued)

FOREIGN PATENT DOCUMENTS

CN 1036414 10/1989

(Continued)

OTHER PUBLICATIONS

Waltereit et al., "Nitride semiconductors free of electrostatic fields for efficient white light-emitting diodes", Nature, vol. 406, Aug. 2000, pp. 865-868.*

(Continued)

*Primary Examiner*—Minh-Loan T Tran
(74) *Attorney, Agent, or Firm*—Morrison & Foerster LLP

(57) ABSTRACT

The object of this invention is to provide a high-output type nitride light emitting device.

The nitride light emitting device comprises an n-type nitride semiconductor layer or layers, a p-type nitride semiconductor layer or layers and an active layer therebetween, wherein a gallium-containing nitride substrate is obtained from a gallium-containing nitride bulk single crystal, provided with an epitaxial growth face with dislocation density of $10^5/cm^2$ or less, and A-plane or M-plane which is parallel to C-axis of hexagonal structure for an epitaxial face, wherein the n-type semiconductor layer or layers are formed directly on the A-plane or M-plane.

In case that the active layer comprises a nitride semiconductor containing In, an end face film of single crystal $Al_xGa_{1-x}N$ ($0 \leq x \leq 1$) can be formed at a low temperature not causing damage to the active layer.

7 Claims, 8 Drawing Sheets

U.S. PATENT DOCUMENTS

| | | | |
|---|---|---|---|
| 5,147,623 A | 9/1992 | Eun et al. | |
| 5,190,738 A | 3/1993 | Parent | |
| 5,306,662 A | 4/1994 | Nakamura et al. | |
| 5,456,204 A | 10/1995 | Dimitrov et al. | |
| 5,589,153 A | 12/1996 | Garces et al. | |
| 5,679,965 A | 10/1997 | Schetzina | |
| 5,780,876 A | 7/1998 | Hata | |
| 5,868,837 A | 2/1999 | DiSalvo et al. | |
| 5,928,421 A * | 7/1999 | Yuri et al. | 117/97 |
| 5,981,980 A | 11/1999 | Miyajima et al. | |
| 6,031,858 A * | 2/2000 | Hatakoshi et al. | 372/46.01 |
| 6,046,464 A | 4/2000 | Schetzina | |
| 6,051,145 A | 4/2000 | Griffith et al. | |
| 6,067,310 A | 5/2000 | Hashimoto et al. | |
| 6,139,628 A | 10/2000 | Yuri et al. | |
| 6,153,010 A | 11/2000 | Kiyoku et al. | |
| 5,156,581 A | 12/2000 | Vuodo et al. | |
| 6,156,581 A * | 12/2000 | Vaudo et al. | 438/22 |
| 6,172,382 B1 | 1/2001 | Nagahama | |
| 6,177,057 B1 | 1/2001 | Purdy | |
| 6,177,292 B1 | 1/2001 | Hong et al. | |
| 6,248,607 B1 | 6/2001 | Tsutsui | |
| 6,249,534 B1 | 6/2001 | Itoh et al. | |
| 6,252,261 B1 | 6/2001 | Usui | |
| 6,258,617 B1 | 7/2001 | Nitta et al. | |
| 6,265,322 B1 | 7/2001 | Anselm et al. | |
| 6,270,569 B1 | 8/2001 | Shibata et al. | |
| 6,303,403 B1 | 10/2001 | Sato et al. | |
| 6,316,785 B1 | 11/2001 | Nunoue et al. | |
| 6,329,215 B1 | 12/2001 | Porowski et al. | |
| 6,355,497 B1 | 3/2002 | Romano et al. | |
| 6,362,496 B1 | 3/2002 | Nanishi et al. | |
| 6,372,041 B1 * | 4/2002 | Cho et al. | 117/84 |
| 6,399,500 B1 | 6/2002 | Porowski et al. | |
| 6,399,966 B1 | 6/2002 | Tsuda | |
| 6,423,984 B1 | 7/2002 | Kato | |
| 6,447,604 B1 | 9/2002 | Flynn et al. | |
| 6,459,712 B2 | 10/2002 | Tanaka et al. | |
| 6,468,882 B2 * | 10/2002 | Motoki et al. | 438/460 |
| 6,475,277 B1 | 11/2002 | Hirota et al. | |
| 6,488,767 B1 | 12/2002 | Xu et al. | |
| 6,509,651 B1 | 1/2003 | Matsubara | |
| 6,531,072 B1 | 3/2003 | Suda et al. | |
| 6,534,795 B2 | 3/2003 | Hori et al. | |
| 6,586,762 B2 | 7/2003 | Kozaki | |
| 6,592,663 B1 | 7/2003 | Sarayama et al. | |
| 6,593,589 B1 | 7/2003 | Osinski et al. | |
| 6,596,079 B1 | 7/2003 | Vaudo et al. | |
| 6,614,824 B2 | 9/2003 | Tsuda | |
| 6,627,552 B1 | 9/2003 | Nishio et al. | |
| 6,639,925 B2 | 10/2003 | Niwa et al. | |
| 6,653,663 B2 | 11/2003 | Ishida | |
| 6,654,225 B2 | 11/2003 | Takayanagi et al. | |
| 6,656,615 B2 | 12/2003 | Dwilinski et al. | |
| 6,677,619 B1 | 1/2004 | Nagahama et al. | |
| 6,686,608 B1 | 2/2004 | Takahira | |
| 6,693,935 B2 | 2/2004 | Tojo et al. | |
| 6,711,191 B1 | 3/2004 | Kozaki | |
| 6,720,586 B1 | 4/2004 | Kidoguchi | |
| 6,749,819 B2 | 6/2004 | Otsuka et al. | |
| 6,858,882 B2 | 2/2005 | Tsuda | |
| 6,924,512 B2 | 8/2005 | Tsuda | |
| 7,053,413 B2 | 5/2006 | D'Evelyn et al. | |
| 7,057,211 B2 * | 6/2006 | Dwilinski et al. | 257/97 |
| 7,081,162 B2 | 7/2006 | Dwilinski et al. | |
| 7,097,707 B2 | 8/2006 | Xu | |
| 7,132,730 B2 | 11/2006 | Dwilinski et al. | |
| 7,160,388 B2 | 1/2007 | Dwiliński et al. | |
| 7,252,712 B2 | 8/2007 | Dwilinski et al. | |
| 7,291,544 B2 | 11/2007 | D'Evelyn et al. | |
| 7,314,517 B2 | 1/2008 | Dwilinski et al. | |
| 7,315,599 B1 | 1/2008 | Morriss | |
| 7,335,262 B2 | 2/2008 | Dwilinski et al. | |
| 7,364,619 B2 | 4/2008 | Dwilinski et al. | |
| 7,374,615 B2 | 5/2008 | Dwilinski et al. | |
| 7,387,677 B2 | 6/2008 | Dwilinski et al. | |
| 7,410,539 B2 | 8/2008 | Dwilinski et al. | |
| 7,420,261 B2 | 9/2008 | Dwilinski et al. | |
| 7,422,633 B2 | 9/2008 | Dwilinski et al. | |
| 2001/0008656 A1 * | 7/2001 | Tischler et al. | 428/34.1 |
| 2001/0015437 A1 | 8/2001 | Ishii et al. | |
| 2001/0022154 A1 * | 9/2001 | Cho et al. | 117/2 |
| 2001/0030328 A1 * | 10/2001 | Ishida | 257/103 |
| 2002/0011599 A1 | 1/2002 | Motoki et al. | |
| 2002/0014631 A1 | 2/2002 | Iwata | |
| 2002/0028564 A1 * | 3/2002 | Motoki et al. | 438/460 |
| 2002/0031153 A1 | 3/2002 | Niwa | |
| 2002/0047113 A1 | 4/2002 | Ohno | |
| 2002/0063258 A1 | 5/2002 | Motoki | |
| 2002/0078881 A1 | 6/2002 | Cuomo | |
| 2002/0189531 A1 | 12/2002 | Dwilinski et al. | |
| 2002/0192507 A1 | 12/2002 | Dwilinski et al. | |
| 2003/0001238 A1 | 1/2003 | Ban | |
| 2003/0003770 A1 | 1/2003 | Morita et al. | |
| 2003/0022028 A1 | 1/2003 | Koike et al. | |
| 2003/0143771 A1 * | 7/2003 | Kidoguchi et al. | 438/46 |
| 2003/0209191 A1 | 11/2003 | Purdy | |
| 2004/0003495 A1 | 1/2004 | Xu | |
| 2004/0031978 A1 * | 2/2004 | D'Evelyn et al. | 257/233 |
| 2004/0089221 A1 | 5/2004 | Dwilinski et al. | |
| 2004/0139912 A1 | 7/2004 | Dwilinski | |
| 2004/0238810 A1 | 12/2004 | Dwilinski et al. | |
| 2004/0244680 A1 | 12/2004 | Dwilinski et al. | |
| 2004/0251471 A1 | 12/2004 | Dwilinski et al. | |
| 2004/0255840 A1 | 12/2004 | Dwilinski et al. | |
| 2004/0261692 A1 | 12/2004 | Dwilinski et al. | |
| 2005/0087124 A1 | 4/2005 | Dwilinski et al. | |
| 2005/0249255 A1 | 11/2005 | Dwilinski et al. | |
| 2006/0032428 A1 | 2/2006 | Dwilinski et al. | |
| 2006/0037530 A1 | 2/2006 | Dwilinski et al. | |
| 2006/0054075 A1 | 3/2006 | Dwilinski et al. | |
| 2006/0054076 A1 | 3/2006 | Dwilinski et al. | |
| 2006/0057749 A1 | 3/2006 | Dwilinski et al. | |
| 2006/0124051 A1 | 6/2006 | Yoshioka et al. | |
| 2006/0138431 A1 | 6/2006 | Dwilinski et al. | |
| 2006/0177362 A1 | 8/2006 | D'Evelyn et al. | |
| 2006/0191472 A1 | 8/2006 | Dwilinski et al. | |
| 2007/0234946 A1 | 10/2007 | Hashimoto et al. | |
| 2008/0050855 A1 | 2/2008 | Dwilinski et al. | |
| 2008/0067523 A1 | 3/2008 | Dwilinski et al. | |
| 2008/0102016 A1 | 5/2008 | Hashimoto | |
| 2008/0108162 A1 | 5/2008 | Dwilinski et al. | |
| 2008/0156254 A1 | 7/2008 | Dwilinski et al. | |
| 2008/0303032 A1 | 12/2008 | Dwilinski et al. | |
| 2009/0072352 A1 | 3/2009 | Hashimoto et al. | |

FOREIGN PATENT DOCUMENTS

| | | |
|---|---|---|
| CN | 1289867 | 4/2001 |
| CN | 1065289 | 5/2001 |
| CN | 1260409 | 6/2006 |
| EP | 0 711 853 B1 | 5/1996 |
| EP | 0 716 457 A2 | 6/1996 |
| EP | 0711853 B1 * | 9/1999 |
| EP | 0 949 731 A2 | 10/1999 |
| EP | 0 973 207 A2 * | 1/2000 |
| EP | 1 088 914 | 4/2001 |
| EP | 1 164 210 A2 | 12/2001 |
| EP | 1 405 936 A1 | 4/2004 |
| EP | 1514958 | 3/2005 |
| EP | 1 616 981 A1 | 1/2006 |
| EP | 1770189 | 4/2007 |
| FR | 2 796 657 | 1/2001 |
| GB | 2 326 160 | 12/1998 |

| | | |
|---|---|---|
| GB | 2 333 521 | 7/1999 |
| JP | 51-41686 | 4/1976 |
| JP | 60-65798 | 4/1985 |
| JP | 2-137287 | 5/1990 |
| JP | 5-183189 | 7/1993 |
| JP | 07-022692 B2 | 3/1995 |
| JP | 7-165498 | 6/1995 |
| JP | 7-249830 | 9/1995 |
| JP | 8-250802 | 9/1996 |
| JP | 9-134878 | 5/1997 |
| JP | 9-508093 | 8/1997 |
| JP | 09-293897 | 11/1997 |
| JP | 10-7496 | 1/1998 |
| JP | 10-70079 | 3/1998 |
| JP | 10-70338 | 3/1998 |
| JP | 10-84161 A | 3/1998 |
| JP | 410070079 A * | 3/1998 |
| JP | 11-54847 | 2/1999 |
| JP | 11-307813 | 11/1999 |
| JP | 11-340573 A | 12/1999 |
| JP | 2000-44400 | 2/2000 |
| JP | 2000-82863 | 3/2000 |
| JP | 2000-82867 A | 3/2000 |
| JP | 2000-216494 | 8/2000 |
| JP | 2000-327495 | 11/2000 |
| JP | 2001-077038 | 3/2001 |
| JP | 2001-85737 | 3/2001 |
| JP | 2001-148510 A | 5/2001 |
| JP | 2001-247399 | 9/2001 |
| JP | 2001-342100 | 12/2001 |
| JP | 2002-026442 | 1/2002 |
| JP | 2002-241112 | 8/2002 |
| JP | 2002-274997 | 9/2002 |
| JP | 2003040699 A | 2/2003 |
| JP | 2003-527296 | 9/2003 |
| JP | 2004168656 A | 6/2004 |
| PL | 347918 | 6/2001 |
| PL | 350375 | 10/2001 |
| WO | WO-94/28204 | 12/1994 |
| WO | WO-97/13891 | 4/1997 |
| WO | WO-98/47170 | 10/1998 |
| WO | WO 98/55671 | 12/1998 |
| WO | WO 01/24284 | 4/2001 |
| WO | WO 01/24921 | 4/2001 |
| WO | WO-01/68955 | 9/2001 |
| WO | WO-02/101124 A1 | 12/2002 |
| WO | WO-02101120 A2 | 12/2002 |
| WO | WO-03/035945 | 5/2003 |
| WO | WO-03/043150 A1 | 5/2003 |
| WO | WO-2004/090202 A1 | 10/2004 |

OTHER PUBLICATIONS

Brandt et al., "Critical issues for the growth of high-quality (Al,Ga)n/GaN and GaN/(In,Ga)N heterostructures on SiC(0001) by molecular-beam epitaxy", Applied Physics Letters, vol. 75, No. 25 (1999), pp. 4019-4021.*
Ketchum et al, "Crystal growth of gallium nitride in supercritical ammonia", J. Crystal Growth (Netherlands), vol. 22, issue 3, pp. 431-434 (Jan. 2001) (also listed in IDS Aug. 29, 2006).*
M. Fukuda, "Optical Semiconductor Devices", Wiley Series in Microwave and Optical Engineering, Ed. K. Chang, John Wiley & Sons, New York 1998; especially p. 7.*
"Modern Semiconductor Device Physics", Ed. S.M. Sze, A Whiley Interscience Publication, John Wiley & Sons, New York 1998; especially Appendix G (pp. 539-540).*
Melnik et al. "Properties of Free-Standing GaN Bulk Crystals Grown by HPVE", Mat. Res. Soc. Symp. Proc. vol. 482 (1998) pp. 269-274.*
Balkas et al. "Growth of Bulk AlN and GaN Single Crystals by Sublimation", Mat. Res. Soc. Symp. Proc. vol. 449 (1997) pp. 41-46.*

Porowski et al. "Bulk and Homeoepitaxial GaN-Growth and Characterisation", Journal of Crystal Growth, 189/190 (1998) pp. 153-158.*
Shin-ichi Hirano et al. (1989) "Hydrothermal Synthesis of Gallium Orthophosphate Crystals," Bull. Chem. Soc. Jpn. 62, pp. 275-278.
(1997). "Single Crystal Growth," Chapter 1 In Hydrothermal Synthesis Handbook. Gihodo Press, Second Edition, pp. 245-255.
R. A. Laudise (1991). "What is Materials Chemistry?" Chapter 27 In Materials for NonLinear Optics: Chemical Perspectives. American Chemical Society. pp. 410-433.
Noboru Sakagami et al. (1974) "Growth Kinetics and Morphology of ZnO Single Crystal Grown under Hydrothermal Conditions," Journal of the Ceramic Association 82, pp. 405-413.
T. Sekiguchi et al. (2000) "Hydrothermal Growth of ZnO Single Crystals and their Optical Characterization," Journal of Crystal Growth 214/215, pp. 72-76.
K. Yanagisawa et al. (1996) "Hydrothermal Single Growth of Calcite in Ammonium Acetate Solution," Journal of Crystal Growth 163, pp. 285-294.
K. Yanagisawa et al. (2001) "Improvement of Quality of Hydrothemally Grown Calcite Single Crystals," Journal of Crystal Growth 229, pp. 440-444.
S. Hirano (1991) "Growth of Gallium Orhophosphate Single Crystals in Acidic Hydrothermal Solutions," Journal of Materials Science 24, pp. 2805-2808.
Notification from Japanese Patent Office dated Mar. 29, 2005 and Submission of Printed Publication.
Mao et al., "New Concept Technology Pressure Variation Liquid Phase Epitaxy", SPIE Photonics Taiwan Conference Proceeding, Jul. 2000, pp. 1-12.
M. Palczewska et al. (1998). "Paramagnetic Defects in GaN," MRS Internet J. Nitride Semicond. Res. 3, 45.
*Preliminary Notice of Rejection of the IPO* (Translation), 3 pages.
Journal of Physics Condensed Matter, v13, n32, Aug. 13, 2001, pp. 6875-6892.
Physica Status Solidi (a) Applied Research, v180, n1, 2000, pp. 51-58.
Akasaki, I. et al. (1991). "Growth and Properties of Single Crystalline GaN Films by Hydride Vapor Phase Epitaxy," Crystal Properties and Preparation 32-34:154-157.
Chu, T. L. et al. (1974). "Crystal Growth and Characterization of Gallium Nitride," J. Electrochem. Soc.: Solid-State Science and Technology 121-1:159-162.
Kaschner, A. et al. (1999). "Influence of Doping on the Lattice Dynamics of Gallium Nitride," MRS Internet J. Nitride Semicond. Res. 4S1, G3.57.
Kim, S. T. et al. (1998). "Preparation and Properties of Free-standing HVPE Grown GaN Substrates," Journal of Crystal Growth 194:37-42.
Kuroda, Naotaka et al. (1998). "Precise Control of Pn-junction Profiles for GaN-based LD structures Using GaN Substrates with Low Dislocation Densities," Journal of Crystal Growth 189/190:551-555.
Motoki, Kensaku et al. (2001). "Preparation of Large Freestanding GaN Substrates by Hydride Vapor Phase Epitaxy Using GaAs as a Starting Substrate," J. Appl. Phys. 40:L140-L143.
Office Action mailed Apr. 20, 2006, directed to related U.S. Appl. No. 10/493,747.
Office Action mailed Apr. 20, 2005, directed to U.S. Appl. No. 10/479,807.
International Search Report mailed Feb. 18, 2003, directed to corresponding international application.
U.S. Application dated Nov. 14, 2006, directed at related U.S. Appl. No. 10/682,891.
Japanese Office Action dated Dec. 26, 2006, directed at JP application No. 2003-544869.
U.S. Office Action dated Mar. 21, 2007, directed at corresponding U.S. Appl. No. 10/479,857.
Porowski, S. (1996). "High pressure growth of GaN—new prospects for blue lasers," Journal of Crystal Growth 166:583-589.
Chinese Office Action dated Apr. 13, 2007, directed to counterpart CN application No. 02802023.
Chinese Office Action mailed Mar. 3, 2006, directed to corresponding CN Application No. 02821230.4.

U.S. Office Action, mailed Jun. 10, 2008, directed to related U.S. Appl. No. 10/514,429. 60 pages.
Dwilinski, R. et al., (1998). "AMMONO Method of GaN and AlN Production," *Diamond and Related Materials*. 7:1348-1350.
Yamane, H. et al., (1998). "Polarity of GaN Single Crystals Prepared with Na Flux," *Japanese Journal of Applied Physics*. 37:3436-3440.
Yano, M. et al., (Oct. 1, 1999). "Control of Nucleation Site and Growth Orientation of Bulk GaN Crystals," *Japanese Journal of Applied Physics*. 38(10):L1121-L1123.
Dwilinski, R. et al., (1998). "AMMONO Method of BN, AlN and GaN Synthesis and Crystal Growth," *MRS Internet J. Nitride Semicond. Res*. 3(25):1-4.
Pakula, K. et al., (1995). "Growth of GaN Metalorganic Chemical Vapour Deposition Layers on GaN Single Crystals," *Acta Physica Polonica A*. 88(5):861-864.
Dwilinski, R. et al., (1996). "On GaN Crystallization by Ammonothermal Method," *Acta Physica Polonica A*. 90(4):763-766.
Dwilinski, R. et al., (1997). "Exciton Photo-Luminescence of GaN Bulk Crystals Grown by the AMMONO Method," *Materials Science & Engineering*. B50:46-49.
Melnik, Y. et al., (1998). "Properties of Free-Standing GAN Bulk Crystals Grown by HVPE," *Materials Research Society*. 482:269-274.
Balkas, C.M. et al., (1997). "Growth of Bulk AlN and GaN Single Crystals by Sublimation," *Materials Research Society*. 449:41-46.
Porowski, S., (1998). "Bulk and Homoepitaxial GaN-Growth and Characterisation," *Journal of Crystal Growth*. 189/190:153-158.
Aoki, M. et al., (2000). "Growth of GaN Single Crystals from a Na-Ga Melt at 750°C and 5MPa of N2,"*Journal of Crystal Growth*. 218:7-12.
Kuramata, A. et al., (1996). "Substrate. For III-V Nitride Semiconductors," *Oyo Buturi*. 65(9):936-940; partial translation of abstract, Section 3.3 and Figure 4.
Supplementary European Search Report, dated Sep. 23, 2008, European Patent Application No. 02788783.5; 3 pages.
Chinese Office Action, dated Jul. 18, 2008, directed to Chinese Patent Application No. 200580040008.X; 25 pages.
Japanese Notification, mailed Mar. 14, 2006, directed to Japanese Patent Application No. 2003-50367; 3 pages.
Japanese Notification of Reason(s) for Refusal, mailed Dec. 16, 2008, directed to Japanese Patent Application No. 2004-505416; 7 pages.
Japanese Notification of Reason(s) for Refusal, mailed Jan. 6, 2009, directed to Japanese Patent Application No. 2004-506101; 7 pages.
U.S. Office Action, mailed Oct. 16, 2007, directed to U.S. Appl. No. 10/538,654; 10 pages.
U.S. Office Action, mailed Apr. 2, 2007, directed to U.S. Appl. No. 10/538,407;13 pages.
Song, Y. et al. (2003)."Bulk GaN Single Crystals: Growth Conditions by Flux Method." *Journal of Crystal Growth*.247:275-279.
Beaumont, B. et al. (2001)."Epitaxial Lateral Overgrowth of GaN." *Phys. Stat. Sol*.(b).227(1);1-43.
Liu, L. et al. (2002). "Substrates for Gallium Nitride Epitaxy." *Reports: A Review Journal, Materials Science and Engineering*. 37:61-127.
Yano, M. et al. (2000). "Growth of Nitride Crystals, BN, AlN and GaN by Using a Na Flux" *Diamond and Related Materials*. 9:512-515.
Yamane, H. et al. (1998). "Morphology and Characterization of GaN Single Crystals Growth in a Na Flux." *Journal of Crystal Growth*. 186:8-12.
Yamane, H. et al. (Jul. 1, 1998). "Na Flux Growth of GaN Single Crystals" *Journal of the Japanese Association for Crystal Growth*. 25(4):14-18.
Purdy, A. (1999)."Ammonothermal Synthesis of Cubic Gallium Nitride." *American Chemical Society. Chem. Mater*. 11(7): 1648-1651.
Sangwal, K. (1994)."Growth Apparatus." Chapter 10.3 *In Elementary Crystal Growth*. Lublin:331.
Lan, Y.C. et al., (Apr. 14, 2000). "Syntheses and Structure of Nanocrystalline Gallium Nitride Obtained from Ammonothermal Method Using Lithium Metal as Mineralizator," *Materials Research Bulletin* 35:2325-2330.

Polish Patent Office Notification and Search Report, dated Jan. 15, 2007, directed to Polish Patent Application No. P-347918/DP. 8 pages.
Peters, D. (1990)."Ammonothermal Synthesis of Aluminium Nitride." *Journal of Crystal Growth*. 104:411-418.
Inoue, T. et al. (2001)."Growth of Bulk GaN Single Crystals by the Pressure-Controlled Solution Growth Method." *Journal of Crystal Growth*.229:35-40.
Kolis, J. W. et al. (1998)."Materials Chemistry and Bulk Crystal Growth of Group III Nitrides in Supercritical Ammonia." *Materials Research Society Symp. Proc*. 495:367-372.
U.S. Office Action, mailed Oct. 29, 2008, directed to related U.S. Appl. No. 10/514,429; 11 pages.
Canadian Office Action, mailed Apr. 2, 2009, directed to Canadian Patent Application No. 2,449,714; 4 pages.
Dwilinski, R. et al., U.S. Office Action, mailed Apr. 28, 2009, directed to a related U.S. Appl. No. 11/969,735; 11 pages.
Japanese Office Action, mailed May 7, 2009, directed to Japanese Patent Application No. 2004-506141; 6 pages (with translation).
Japanese Office Action, mailed May 12, 2009, directed to Japanese Patent Application No. 2003-544869; 6 pages (with translation).
Chinese Office Action dated Apr. 18, 2004, directed to Chinese Patent Application No. 02801950.4; 9 pages.
Chinese Office Action dated Aug. 5, 2004, directed to Chinese Patent Application No. 02821231.2; 11 pages.
Chinese Office Action dated Dec. 28, 2007 directed to Chinese Patent Application No. 02802023.5; 8 pages.
European Search Report, dated Aug. 22, 2007, directed to European Patent Application No. 02775396.1; 3 pages.
Ikornikova, N. IO. (1975). "Hydrothermal Synthesis of Crystals in Chloride Systems," *Izd. Nauka*, ed. Moscow: 124-125; 132-133.
International Search Report, mailed Apr. 21, 2006, directed to International Patent Application No. PCT/JP2005/022396; 3 pages.
International Search Report, mailed May 7, 2004, directed to International Patent Application No. PCT/JP03/15906; 3 pages.
International Search Report, mailed Sep. 29, 2005, directed to International Patent Application No. PCT/JP2005/011091; 3 pages.
Japanese Notification of Provision of Relevant Information on Prior Arts, mailed Dec. 24, 2008, directed to Japanese Patent Application No. 2004-558483; 14 pages.
Kato, H. et al. (May 28, 1988)."MOVPE Growth of GaN on off-angle sapphire substrate", *IEICE Technical Report. The Institute of Electronics, Information and Communication Engineers of Japan*. Tokyo, Japan. 88(61):9 pages.
Kelly et al., (1996). "Optical Patterning of GaN Films," *Appl. Phys. Lett*. 69(12):1749-1751.
Notification from Japanese Patent Office dated Mar. 14,2006, directed to Japanese Patent Application No. 2003-503867; 21 pages (partial English translation).
Penkala, T., (1972). "Zarys Krystalografii (Basics of Crystallography)". PWN, Warszawa: 349 (3 pages).
Porowski, S. et al. (1993). "Prospects for High-Pressure Crystals Growth of III-V Nitrides." *Inst. Phys. Conf. Ser*. 134(4):369-372.
Sakai, A. et al., (Oct. 20, 1997). "Defect structure in selectively grown GaN films with low threading dislocation density." *Appl. Phys. Lett*. 71:2259-2261.
Wong, S. W. et al. (Sep. 6, 1999). "Fabrication of Thin-Film InGaN Light-Emitting Diode Membranes by Laser Lift-Off." *American Institute of Physics Applied Physics Letter*. 75(10):1360-1362.
Dwilinski, R. et al., U.S. Office Action, mailed Jun. 4, 2007, directed to a related U.S. Appl. No. 10/519,141; 5 pages.
Dwilinski, R. et al., U.S. Office Action, mailed Nov. 14, 2006, directed to a related U.S. Appl. No. 10/519,141; 5 pages.
Dwilinski, R. et al., U.S. Office Action, mailed Mar. 23, 2005 directed to a related U.S. Appl. No. 10/147,319; 7 pages.
Dwilinski, R. et al., U.S. Office Action, mailed Jul. 1, 2004, directed to a related U.S. Appl. No. 10/147,319; 15 pages.
Dwilinski, R. et al., U.S. Office Action, mailed Oct. 19, 2005, directed to a related U.S. Appl. No. 10/147,319; 6 pages.
Dwilinski, R. et al., U.S. Office Action, mailed Mar. 21, 2007, directed to a related U.S. Appl. No. 10/538,349; 6 pages.
Dwilinski, R. et al., U.S. Office Action, mailed Oct. 18, 2007, directed to a related U.S. Appl. No. 10/538,407; 8 pages.

D'Evelyn, M. et al., U.S. Office Action, mailed Dec. 9, 2004, directed to a related U.S. Appl. No. 10/440,574; 8 pages.
Dwilinski, R. et al., U.S. Office Action, mailed Nov. 4, 2005, directed to a related U.S. Appl. No. 10/493,747; 7 pages.
Dwilinski, R. et al., U.S. Office Action, mailed Apr. 28, 2008, directed to a related U.S. Appl. No. 10/537,804; 5 pages.
Dwilinski, R. et al., U.S. Office Action, mailed Jun. 11, 2009, directed to a related U.S. Appl. No. 10/537,804; 5 pages.
Dwilinski, R. et al., U.S. Office Action, mailed Dec. 23, 2008, directed to a related U.S. Appl. No. 10/537,804; 11 pages.
Dwilinski, R. et al., U.S. Office Action, mailed Dec. 23, 2005, directed to a related U.S. Appl. No. 10/479,807; 6 pages.
Dwilinski, R. et al., U.S. Office Action, mailed Feb. 17, 2005, directed to a related U.S. Appl. No. 10/479,856; 5 pages.
Dwilinski, R. et al., U.S. Office Action, mailed Jul. 7, 2005, directed to a related U.S. Appl. No. 10/479,856; 5 pages.
Dwilinski, R. et al., U.S. Office Action, mailed Sep. 7, 2006, directed to a related U.S. Appl. No. 10/479,857; 18 pages.
Dwilinski, R. et al., U.S. Office Action, mailed Oct. 17, 2007, directed to a related U.S. Appl. No. 10/479,857; 12 pages.
Dwilinski, R. et al., U.S. Office Action, mailed May 26, 2006, directed to a related U.S. Appl. No. 10/479,858; 6 pages.
Dwilinski, R. et al., U.S. Office Action, mailed Oct. 4, 2005, directed to a related U.S. Appl. No. 10/479,858; 7 pages.
Dwilinski, R. et al., U.S. Office Action, mailed Apr. 26, 2006, directed to a related U.S. Appl. No. 10/682,891; 6 pages.
Dwilinski, R. et al., U.S. Office Action, mailed Apr. 27, 2005, directed to a related U.S. Appl. No. 10/682,891; 5 pages.
Dwilinski, R. et al., U.S. Office Action, mailed Jul. 10, 2007, directed to a related U.S. Appl. No. 10/682,891; 6 pages.
Dwilinski, R. et al., U.S. Office Action, mailed Sep. 2, 2008, directed to a related U.S. Appl. No. 10/682,891; 6 pages.
Dwilinski, R. et al., U.S. Office Action, mailed Dec. 27, 2007, directed to a related U.S. Appl. No. 10/682,891; 6 pages.
Dwilinski, R. et al., U.S. Office Action, mailed Oct. 1, 2008, directed to a related U.S. Appl. No. 11/791,716; 7 pages.
Dwilinski, R. et al., U.S. Office Action, mailed Jun. 1, 2009, directed to a related U.S. Appl. No. 11/791,716; 8 pages.
Chinese Office Action, dated Jun. 5, 2009, directed to Chinese Patent Application No. 200580040008.X; 13 pages.
European Office Action mailed on Jul. 2, 2009 directed at application No. 03778841.1; 3 pages.
European Office Action mailed on Jul. 6, 2009 directed at application No. 03733682.3; 4 pages.
Japanese Notification of Reasons for Refusal mailed on Jul. 28, 2009, directed to Japanese Patent Application No. 2003-538438; 6 pages.
European Office Action dated Oct. 21, 2009, directed to related EP Application No. 02 762 734.8; 4 pages.
Japanese Notification of Reasons for Refusal dated Nov. 4, 2009, directed to related JP Application No. 2004-506101; 4 pages.
Chen et al., "Modeling of Ammonothermal Growth of Nitrides", *Journal of Crystal Growth 258* (2003); pp. 181-187.
Chen et al., "Effects of Baffle Design on Fluid Flow and Heat Tranfer in Ammonothermal Growth of Nitrides", *Journal of Crystal Growth 266* (2004); pp. 271-277.
Yoshikawa et al., "Crystal Growth of GaN by Ammonothermal Method", *Journal of Crystal Growth 260* (2004); pp. 67-72.
Hashimoto et al., "Growth of Gallium Nitride via Fluid Transparent in Superficial Ammonia", *Journal of Crystal Growth 257* (2005); pp. e525-e530.
Raghothamachar et al., "Characterization of Bulk Grown GaN and AlN Single Crystal Materials", *Journal of Crystal Growth 287* (2006), pp. 349-353.
Dwilinski, R. et al., U.S. Office Action mailed Dec. 4, 2009, directed to a related U.S. Appl. No. 11/969,735; 14 pages.
R. Dwilinski et al., AMMONO method of GaN and AlN production, May 18, 1998, pp. 1348-1350.
Hisanori Yamane, Polarity of GaN Single Crystals Prepared with Na Flux, pp. 3436-3440.
Masichi Yano et al., Control of Nucleation Site and Growth Orientation of Bulk GaN Crystals.
R. Dwilinski et al., AMMO method of BN, AlN and GaN synthesis and crystal growth, pp. 1-4.
K. Pakula et al., Growth of GaN Metalorganic Chemical Vapour Deposition Layers on GaN Single Crystals, vol. 88 (1995), pp. 861-864.
R. Dwilinski et al., On GaN Crystallization by Ammonothermal Method, vol. 90(1996, pp. 763-766.
R. Dwilinski et al., Exciton plhoto-liminescence of GaN bulk crystals grown by the AMMONO method, (1997), pp. 46-49.
Douglas R. Ketchum et al., Crystal growth of gallium nitride in supercritical ammonia, (2001) pp. 431-434.
Yu Melnik et al., Properties of free-standing gan bulk crystals grown by hvpe, 1998, pp. 269-274.
C.M. Balkas et al., Growth of Bulk AlN and GaN Single Crystals by Sublimation, vol, 449 1997, pp. 41-46.
Sylwester Porowski, Bulk and homoepitaxial GaN-growth and characterisation, 1998, pp. 153-158.
Masato Aoki et al. Growth of GaN single crystals from a Na-Ga melt at 750 degreesC and 5Mpa of N2, 2000, pp. 7-12.

* cited by examiner

LIGHT EMITTING ELEMENT STRUCTURE USING NITRIDE BULK SINGLE CRYSTAL LAYER

TECHNICAL FIELD

This invention relates to a structure wherein a single crystal nitride layer prepared by a supercritical ammonia is used as a substrate or an intermediate layer of light emitting devices such as a laser structure etc.

BACKGROUND ART

In the laser structure, crystal defect or dislocation of a waveguide causes electron-hole pairs to make non-radiative recombination therein. Ideally, considering the laser function, the dislocation density in the waveguide should be $10^4/cm^2$ or less. However, in the present situation, the dislocation density can not be reduced less than $10^6/cm^2$ by using a vapor phase epitaxial growth (MOCVD and HVPE) or by using a repeated ELOG (Epitaxial lateral overgrowth) because the waveguide is grown on a heterogeneous substrate, such as sapphire substrate or SiC substrate.

The thickness of the epitaxial layer should be 100 μ or less to form the epitaxial layer on a sapphire substrate or a SiC layer without crack by the vapor phase growth. Moreover, a nitride crystal is formed on C-plane as an epitaxial growth face on the heterogeneous substrate such as the SiC substrate or the sapphire substrate by a vapor phase growth, which leads the active layer of the laser structure formed thereon to have a spontaneous polarization or piezo polarization causing a deterioration of the performance such as red shift of light emitting, recombination degradation and increase of the threshold current.

Moreover, in case that the active layer deposited on the heterogeneous substrate is formed by a quantum well layer containing In, the active layer is influenced by the crystal condition of the n-type nitride layer as a base, therefore it is necessary to form an undoped GaN layer or super lattice structure layer as the base. On the other hand, when the p-type nitride layer is deposited on the active layer containing In, a protective layer is preferably formed to avoid the active layer degradation by evaporation of In therefrom. When the protective layer for GaN or AlGaN layer is formed, the protective layer is formed at a temperature from 800° C. to 900° C. which is lower than that at formation of the active layer. Accordingly, a resultant nitride layer will be in the form of amorphous, which influences the crystal condition of the optical guide layer and p-type clad layer formed thereon.

To summarize the above, there is a limitation to form layers of the laser device by a vapor phase growth. Moreover, regarding the light emitting diode, in case that the higher luminance and higher output are required, the crystal dislocation of the substrate and the intermediate layer will be a serious problem.

DISCLOSURE OF INVENTION (Problems to be Solved by the Invention)

The first object of this invention is to form a nitride substrate having a lower dislocation density, i.e. $10^5/cm^2$ or less and more preferably $10^4/cm^2$ or less by using a supercritical ammonia technology instead of the so-far used vapor phase growth technology and to form thereon a laser structure having less crystal dislocation causing non-radiative recombination.

The second object of this invention is to provide a laser device not influenced by the polarization, that is, to form a laser structure on non-polar nitride A-plane substrate or non-polar M-plane substrate by obtaining a nitride bulk single crystal layer in a supercritical condition instead of a vapor phase growth.

The third object of this invention is to provide a light emitting device structure wherein especially intermediate layers influencing the crystalline of the active layer are prepared by a supercritical ammonia method instead of a vapor phase growth method so that there can be obtained the intermediate layers having lower crystal dislocation which can not be obtained by a vapor phase growth.

(Means for Solving the Problems)

The inventors of the present invention found the following matters:

the ratio of $Ga/NH_3$ can remarkably be improved (over 20 times), compared with the ratio set by MOCVD vapor phase growth, by using a technique wherein a gallium-containing nitride is recrystallized by a supercritical ammonia, so-called AMMONO method, the bulk single crystal having a lower dislocation density can be obtained by AMMONO method at a very low temperature (600° C. or less), compared with the bulk single crystal prepared by a vapor phase growth of the nitride at 1000° C. or higher, and the single crystal substrate which can never be obtained by the so-far vapor phase growth can be obtained wherein the single crystal substrate is formed on A-plane or M-plane as an epitaxial growth face by AMMONO method.

According to a first aspect of the present invention, there is provided a light emitting device structure comprising a gallium-containing nitride single crystal substrate, and an n-type gallium-containing nitride semiconductor layer or layers, a gallium-containing nitride semiconductor active layer and a p-type gallium-containing nitride semiconductor layer or layers by a vapor phase growth on the substrate, wherein the single crystal substrate is obtained from a gallium-containing nitride bulk single crystal, and provided with an epitaxial growth face with dislocation density of $10^5/cm^2$ or less. The crystal dislocation of the epitaxial growth face of the substrate according to the present invention can be reduced compared with those obtained by the so-far vapor phase growth, especially ELOG method, due to which the epitaxial layer formed thereon has a good crystalline quality without formation of a lower temperature buffer layer and the excellent device structure can be formed.

According to the present invention, a gallium-containing nitride single crystal substrate means not only a substrate wholly formed by a gallium-containing nitride but also a composite substrate (template) in which a gallium-containing nitride is grown on a heterogeneous substrate. The gallium-containing nitride is formed on the heterogeneous substrate in the supercritical ammonia by applying the method which comprises preforming GaN, AlN or AlGaN layer on the heterogeneous substrate and then forming the gallium-containing nitride thereon.

According to a second aspect of the present invention, there is provided a light emitting device structure comprising a gallium-containing nitride single crystal substrate, and an n-type gallium-containing nitride semiconductor layer or layers, a gallium-containing nitride semiconductor active layer and a p-type gallium-containing nitride semiconductor layer or layers by a vapor phase growth on the substrate, wherein the single crystal substrate is obtained from a gallium-containing nitride bulk single crystal, and provided with A-plane or M-plane (FIG. 5) which is parallel to C-axis of hexagonal structure for an epitaxial growth, and wherein the n-type semiconductor layer or layers are formed directly or through Al(Ga)N buffer layer on A-plane or M-plane.

According to the present invention, a nitride bulk single crystal shown in Drawings can be prepared by applying AMMONO method, therefore A-plane or M-plane which is parallel to C-axis of hexagonal structure for an epitaxial growth can be obtained. (FIG. 5) In the present situation, an epitaxial growth required by a device structure can be carried out since the plane has the area of 100 mm². A-plane and M-plane has non-polar, differently from C-plane, therefore there can be obtained the laser device having no cause of the deterioration of the performance such as the red shift of light emitting, recombination degradation and increase of the threshold current.

The substrate is A-plane or M-plane of the gallium-containing nitride and further the dislocation density of the substrate is preferably $10^5/cm^2$ or less.

According to the first and second aspects of the present invention, epitaxial layer is formed on the one side of the gallium-containing nitride single crystal substrate. However, the light emitting device can be formed by growing the epitaxial layer on both sides of the substrate so that undoped GaN, AlN or AlGaN layer prepared by AMMONO method can be used as an intermediate layer. According to a third aspect of the present invention, a nitride light emitting device which comprises an n-type nitride semiconductor layer or layers, a p-type nitride semiconductor layer or layers and a nitride active layer containing In therebetween is characterized in that at least an n-type nitride semiconductor layer or layers containing n-type purities are formed on one side of the nitride bulk single crystal substrate, the nitride active layer and a p-type nitride semiconductor layer or layers are formed directly or through an n-type nitride semiconductor layer or layers on the other side of the nitride bulk single crystal.

It is necessary to make the thickness of the substrate enough thin after the formation of the epitaxial layer on the one side, since the substrate is intermediate layer of the device. However, the crystal dislocation of the substrate prepared by AMMONO method is remarkably reduced, due to which the active layer can be formed directly or through an n-type semiconductor layer or layers, for example an n-type clad layer or an n-type guide layer, differently from the conventional active layer formed through an n-type buffer layer, an undoped GaN layer, an n-type superlattice layer etc. This leads to improve the crystal quality of the active layer. Especially, the polarization influence in the active layer can be eliminated by using the substrate formed on A-plane or M-plane.

According to a third aspect of the present invention, the nitride bulk single crystal layer prepared by AMMONO method is used as an intermediate layer. Further, the intermediate layer can directly be prepared by AMMONO method. According to a forth aspect of the present invention, GaN or AlGaN single crystal layer is formed at a low temperature not causing the degradation of the active layer containing In, wherein In contained in the active layer is not evaporated onto the nitride active layer containing n-type nitride In.

A desired temperature not causing damage to the active layer comprising nitride semiconductor containing In should be lower than a temperature at which the active layer comprising nitride semiconductor containing In is formed. The active layer comprising nitride semiconductor containing In is grown usually at 900° C. and that temperature or less does not cause damage to the active layer due to degradation etc. Therefore, by applying AMMONO method, the nitride is grown at 600° C. or less, preferably 550° C. or less. Therefore, the active layer containing In which comprises single crystal GaN or AlGaN layer can be formed without degradation.

According to the present invention, the protective layer for the active layer may be composed of single crystal $Al_xGa_{1-x}N$ ($0 \leq x \leq 1$). The mixture ratio of crystal may be set higher than those of the optical guide layer and the clad layer. In AMMONO method, the single crystal layer is usually composed of an undoped single crystal. Especially, the mixture ratio of AlGaN layer in the direction of the thickness is not uniform. The mixture ratio of crystal tends to be lesser than that of the initial period of the formation thereof, which does not make any hindrance to the function of the protective layer. In the cap layer according to the present invention, the function thereof can be attained even if the cap layer has a thickness from several nm to several tens nm. For this, when AMMONO method is applied, alkali metal, especially Li ion, may preferably be used as a mineralizer. Moreover, in AMMONO method, it is recommended that GaN barrier layer of InGaN well layer/GaN barrier layer should be positioned on the top of the active layer and that the end thickness of the typical barrier layer should be thicker than usual, considering the dissolution due to contact with a supercritical ammonia at the initial period of applying AMMONO method.

According to the present invention, when the nitride semiconductor laser device is grown on A-plane of GaN substrate formed in the supercritical ammonia, the active layer of the laser device is not influenced by the polarization effect. The light emitting face of the resonator is M-plane, on which the end face film is formed and cleavage is easily performed. In case that the nitride semiconductor laser device is grown on M-plane of GaN substrate formed in the supercritical ammonia, the active layer is not influenced by the polarization effect and A-plane end face film having non-polar can be obtained on the light emitting face of the resonator.

When the intermediate layer is prepared by AMMONO method, it is recommended that a mask should be formed wherein the mask has lower or same solubility in the supercritical ammonia than that of the intermediate layer to cover the surfaces other than the intermediate layer. The formation of the mask can prevent the dissolution from the end face of the other layers of the nitride semiconductor, especially the active layer in the supercritical ammonia having high solubility. The mask may be selected from the group consisting of SiO, SiN, AlN, Mo and W. In the supercritical ammonia these materials for mask are more stable than GaN and the dissolution of the contact surface covered with the mask material can be prevented. In a later process, i.e. a formation process of ridge, the mask can be easily removed.

In AMMONO method using supercritical ammonia, a nitride semiconductor is grown in a supercritical ammonia wherein a nitride gallium compound has the negative dissolution curve. Detailed explanation of the method is disclosed in Polish Patent Application Nos. P-347918, P-350375 and PCT Application No. PCT/IB02/04185. Those skilled in the art can easily carry out the present invention with reference to the abstract and examples explained below.

In the present invention, gallium-containing nitride or nitride is defined as below and as the general formula $Al_xGa_{1-x-y}In_yN$, where $0 \leq x < 1$, $0 \leq y < 1$, and $0 \leq x+y < 1$, and may contain a donor, an acceptor, or a magnetic dopant, as required. As will be defined later, the supercritical solvent contains $NH_3$ and/or a derivative thereof. The mineralizer contains alkali metal ions, at least, ions of lithium, sodium or potassium. On the other hand, the gallium-containing feedstock is mainly composed of gallium-containing nitride or a precursor thereof. The precursor is selected from an azide, imide, amidoimide, amide, hydride, intermetallic compound, alloy or metal gallium, each of which contains gallium, and it will be defined later.

According to the present invention, the seed can be comprised with GaN prepared by HVPE, the crystal formed on the wall in the autoclave by spontaneous growth of AMMONO method, the crystal prepared by flux method or the crystal prepared by high-pressure method. It is preferable that a heterogeneous seed has a lattice constant of 2.8 to 3.6 with respect to $a_o$-axis and a surface dislocation density of $10^6/cm^2$ or less. Such a seed is selected from a body-centered cubic crystal system Mo or W, a hexagonal closest packing crystal system α-Hf or α-Zr, a tetragonal system diamond, a WC structure crystal system WC or $W_2C$, a ZnO structure crystal system SiC, especially α-SiC, TaN, NbN or AlN, a hexagonal (P6/mmm) system $AgB_2$, $AuB_2$ $HfB_2$ or $ZrB_2$, and a hexagonal (P6$_3$/mmc) system γ-MoC ε-MbN or $ZrB_2$. In order to make the surface property the appropriate condition for crystal growth, Ga irradiation, $NH_3$ process and Oxygen plasma process should be carried out as required so that the heterogeneous seed has the GaN polar or N polar. Moreover, HCl process, HF process should be carried out, as required, to purify the surface. Or a GaN or AlN layer is formed on the heterogeneous seed by a vapor phase growth so that the crystallization can effectively be carried out by AMMONO method.

In the present invention, the crystallization of gallium-containing nitride is carried out at a temperature of 100 to 800° C., preferably 300 to 600° C., more preferably 400 to 550° C. Also, the crystallization of gallium-containing nitride is carried out under a pressure of 100 to 10,000 bar, preferably 1,000 to 5,500 bar, more preferably 1,500 to 3,000 bar.

The concentration of alkali metal ions in the supercritical solvent is so adjusted as to ensure the specified solubilities of feedstock and gallium-containing nitride, and the molar ratio of the alkali metal ions to other components of the supercritical solution is controlled within a range from 1:200 to 1:2, preferably from 1:100 to 1:5, more preferably from 1:20 to 1:8.

In this regard, the present invention relates to a technique of an ammono-basic growth of a crystal which comprises a chemical transport in a supercritical ammonia solvent containing at least one mineralizer for imparting an ammono-basic property, to grow a single crystal of gallium-containing nitride. This technique has a very high originality, and therefore, the terms herein used should be understood as having the meanings defined as below in the present specification.

The term "gallium-containing nitride" in the specification means a compound which includes at least gallium and nitrogen atom as a consistent element. It includes at least the binary compound GaN, ternary compounds such as AlGaN, InGaN or also quaternary compounds AlInGaN, where the range of the other elements to gallium can vary, in so far as the crystallization growth technique of ammonobasic is not hindered.

The term "gallium-containing nitride bulk single crystal" means a gallium-containing nitride single crystal substrate on which an optic and electronic device such as LED or LD can be prepared by an epitaxial growing process such as MOCVD, HVPE or the like.

The term "a precursor of gallium-containing nitride" means a substance which contains at least gallium, and if needed, an alkali metal, an element of the Group XIII, nitrogen and/or hydrogen, or a mixture thereof, and examples of such a precursor includes metallic Ga, an alloy or an intermetallic compound of Ga, and a hydride, amide, imide, amidoimide or azide of Ga, which can form a gallium compound soluble in a supercritical ammonia solvent as defined below.

The term "gallium-containing feedstock" means a gallium-containing nitride or a precursor thereof.

The term "supercritical ammonia solvent" means a supercritical solvent which contains at least ammonia, and ion or ions of at least one alkali metal for dissolving gallium-containing nitride.

The term "mineralizer" means a supplier for supplying one or more of alkali metal ions (Li, K, Na or Cs) for dissolving gallium-containing nitride in the supercritical ammonia solvent.

The phrase "the dissolution of the gallium-containing feedstock by AMMONO method" means a reversible or irreversible process in which the above feedstock takes the form of a gallium compound soluble in the supercritical solvent such as a gallium complex compound. The gallium complex compound means a complex compound in which a gallium as a coordination center is surrounded by ligands, e.g., $NH_3$ or derivatives thereof such as $NH_2^-$ and $NH_2^-$.

The term "supercritical ammonia solution" means a solution including a soluble gallium-containing compound formed by the dissolution of the gallium-containing feedstock in the supercritical ammonia solvent. Based on our experiment, we have found that there is an equilibrium relationship between the gallium-containing nitride solid and the supercritical solution under a sufficiently high temperature and pressure atmosphere. Accordingly, the solubility of the soluble gallium-containing nitride can be defined as an equilibrium concentration of the above soluble gallium-containing nitride in the presence of solid gallium-containing nitride. In such a process, it is possible to shift this equilibrium according to change in temperature and/or pressure.

The phrase "negative temperature coefficient of the solubility" shown in the gallium-containing nitride in the supercritical ammonia means that the solubility is expressed by a monotonically decreasing function of the temperature, when all other parameters are kept constant. Similarly, the phrase "positive pressure coefficient of the solubility" means that the solubility is expressed by a monotonically increasing function of the pressure, when all other parameters are kept constant. Based on our research, the solubility of gallium-containing nitride in the supercritical ammonia solvent, at least, has a negative temperature coefficient within a range of 300 to 550° C., and a positive pressure coefficient within a range of 1 to 5.5 Kbar, respectively.

The phrase "oversaturation of the supercritical ammonia solution of gallium-containing nitride" means that the concentration of the soluble gallium compounds in the above supercritical ammonia solution is higher than a concentration in an equilibrium state, i.e., the solubility of gallium-containing nitride. In case of the dissolution of gallium-containing nitride in a closed system, such oversaturation can be achieved, according to a negative temperature coefficient or a positive pressure coefficient of the solubility, by raising the temperature or reducing the pressure.

The chemical transport from the lower temperature dissolution zone to higher temperature dissolution zone crystallization zone is important for gallium-containing nitride in the supercritical ammonia solution. The phrase "the chemical transport" means a sequential process including the dissolution of gallium-containing feedstock, the transfer of the soluble gallium compound through the supercritical ammonia solution, and the crystallization of gallium-containing nitride from the oversaturated supercritical ammonia solution. In general, a chemical transport process is carried out by a certain driving force such as a temperature gradient, a pressure gradient, a concentration gradient, difference in chemical or physical properties between a dissolved feedstock and a crystallized product, or the like. Preferably, the chemical transport in the process of the present invention is achieved by carrying out the dissolution step and the crystallization step in separate zones, on condition that the temperature of the crystallization zone is maintained higher than that of the dissolution zone so that the gallium-containing nitride bulk single crystal can be obtained by the processes of this invention.

The term "seed" has been described above. According to the present invention, the seed provides a region or area on which the crystallization of gallium-containing nitride is allowed to take place, and the growth quality of the crystal depends on the quality of the seed. Thus, the seed with good qualities is selected.

The term "spontaneous crystallization" means an undesirable phenomenon in which the formation and the growth of the core of gallium-containing nitride from the oversaturated supercritical ammonia solution occur at any site inside the autoclave, and the spontaneous crystallization also includes disoriented growth of the crystal on the surface of the seed.

The term "selective crystallization on the seed" means a step of allowing the crystallization to take place on the face of the seed, accompanied by substantially no spontaneous growth. This selective crystallization on the seed is essential for the growth of a bulk single crystal, it is also one of the conditions to form the intermediate layer by applying AMMONO method.

The autoclave to be used in the present invention is a closed system reaction chamber for carrying out the ammono-basic growth of the crystal and any form of the autoclave is applicable.

In this regard, the temperature distribution in the autoclave as will be described later in the part of Examples is determined by using the autoclave empty inside without the supercritical ammonia, and thus, the supercritical temperature is not one actually measured. On the other hand, the pressure in the autoclave is directly measured, or it is determined by the calculation from the amount of ammonia firstly introduced, and the temperature and the volume of the autoclave.

It is preferable to use an apparatus as described below, to carry out the above process. An apparatus according to the present invention provides an autoclave for producing a supercritical solvent, characterized in that a convection-controller is arranged in the autoclave, and a furnace unit is equipped with a heater or a cooler.

The furnace unit includes a higher temperature zone equipped with a heater which corresponds to a crystallization zone in the autoclave, and a lower temperature zone equipped with a heater or a cooler which corresponds to a dissolution zone in the autoclave. The convection controller may be composed of at least one horizontal baffle which has a hole at the center or at its periphery and which partitions the crystallization zone from the dissolution zone. Inside the autoclave, a feedstock is set in the dissolution zone, and a seed is set in the crystallization, zone, and convection in the supercritical solution between two zones is controlled by the controller. It is to be noted that the dissolution zone is located above the horizontal baffle, and the crystallization zone, below the horizontal baffle.

AMMONO method is summarized as follows. In the reaction system, the negative dissolution curve means that a solubility of the nitride semiconductor is low in the higher temperature zone and a solubility thereof is high in the lower temperature zone. When the temperature difference is controlled properly in the higher temperature zone and the lower temperature zone inside the autoclave, nitrides are dissolved in the lower temperature zone and nitrides are recrystallized in the higher temperature zone. Due to the generated convection flow from the lower temperature zone to the higher temperature zone, a predetermined concentration of nitrides can be kept in the higher temperature zone and the nitrides can be selectively grown on a seed.

The wafer is thus placed in the higher temperature zone, and the feedstock in the lower temperature zone in the reaction system inside the autoclave. Dissolution of the feedstock in the lower temperature zone leads to the oversaturation. In the reaction system, a convection flow is generated, due to which the dissolved feedstock is transported to the higher temperature zone. Due to a lower solubility at the higher temperature zone, the dissolved feedstock becomes recrystallized on the wafer which is a seed. Recrystallization approached in this way results in forming a bulk single crystal layer. Moreover, a characteristic feature of this method, as compared to the methods by which nitride semiconductor is formed from a vapor phase growth at a temperature over 900° C., is the fact that it allows growth of nitride semiconductor at a temperature preferably 600° C. or less, and more preferably 550° C. or less. Due to this, in the wafer placed in the higher temperature zone a thermal degradation of the active layer containing In does not take place.

The material of the feedstock depends on the composition of the single crystal layer. In case that GaN is used, GaN single crystal, GaN poly crystal, GaN precursor or metallic Ga can generally be used, wherein GaN single crystal or GaN poly crystal can be formed and then recrystallized. GaN prepared by a vapor phase growth, such as HVPE method or MOCVD method, by AMMONO method, by flux method or by high pressure method can be used. The precursor of GaN can contain gallium azide, gallium imide, gallium amide or the mixture thereof. Regarding AlN, similarly as GaN, AlN single crystal, AlN poly crystal, AlN precursor or metallic Al can be used, wherein AlN single crystal or AlN poly crystal can be formed and then recrystallized. AlGaN is a mix crystal of AlN and GaN, and the feedstock thereof should be mixed appropriately. Moreover, the usage of metal and single crystal or poly crystal (for example, metallic Al and GaN single crystal or poly crystal) or the usage of more than two kinds of mineralizer etc. can lead to a predetermined composition.

It is possible to use alkali metals, such as Li, Na, K, Cs or compounds of alkali metals, such as alkali metal amide, alkali metal imide as a mineralizer. A molar ratio of the alkali metal to ammonia ranges from 1:200 to 1:2. Li is preferably used. Li is a mineralizer whose solubility is low, of which leads to restraint of dissolution of the uncovered end face and effective formation of the thin protective film of the thickness from ten to several tens nm.

BEST MODE FOR CARRYING OUT THE INVENTION

Further herein a detailed description of the embodiments of the present invention is provided.

Figure 1:
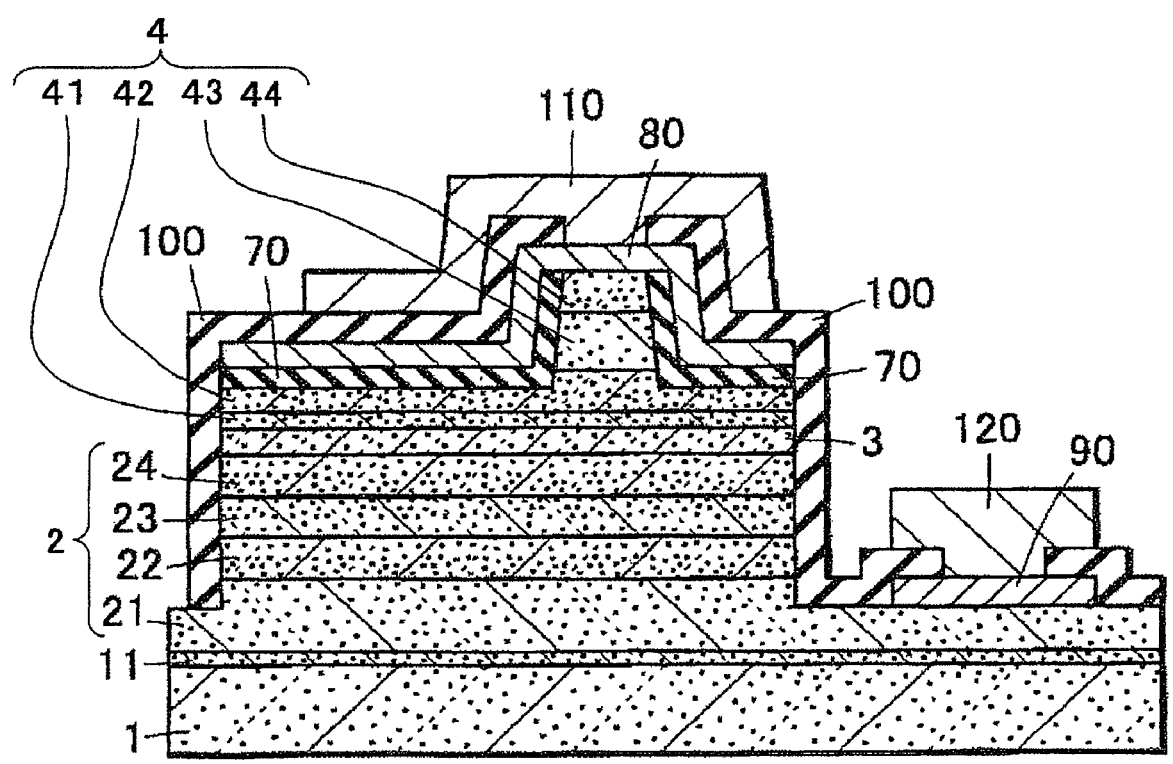
FIG. 1 is a schematic sectional view of the end face of the nitride semiconductor laser device according to the present invention.

The schematic sectional view of the semiconductor laser according to the present invention is shown in FIG. 1. On the GaN substrate 1 the n-type nitride semiconductor layer or layers 2 and the p-type nitride semiconductor layer or layers 4 are deposited. Between them there is the active layer 3 of a single quantum well or a multi quantum well structure in the form of a nitride semiconductor containing In. This results in the laser device having a good light emitting efficiency at the wavelength region between near-ultraviolet and green visible light (from 370 nm to 550 nm). The n-type nitride semiconductor layer or layers 2 are composed of an n-type GaN contact layer 21, a InGaN crack-preventing layer 22, an n-type AlGaN clad layer 23 and an n-type GaN optical guide layer 24. The crack-preventing layer 22 can be omitted. The p-type nitride semiconductor layer or layers 4 are composed of an AlGaN protective layer 41, a p-type AlGaN optical guide layer 42, a p-type AlGaN clad layer 43 and a p-type GaN contact layer 44. The GaN substrate 1 is comprised with a bulk single crystal and the dislocation thereof is remarkably low, i.e. about $10^4/cm^2$. Therefore, the n-type contact layer 21 can be formed on the GaN substrate without ELO layer for decreasing dislocation or AlGaN layer for decreasing the pits. In the above embodiment, the resonator of the semiconductor laser device is composed of the active layer 3, the p-type optical guide layer 24, n-type optical guide layer 42 and the cap layer 41. The light emitting end face of the resonator is covered with the end face film 5 of single crystal $Al_xGa_{1-x}N$ ($0 \leq x \leq 1$).

Further herein the two typical manufacturing methods of the nitride semiconductor laser device of the present embodiment are provided.

FIG. 2A-E illustrates a manufacturing method which comprises the steps of forming the laser structure on C-plane of the GaN substrate, covering surface other than the light emitting end face of the resonator with a mask and forming the end face film to cover the light emitting end face.

Figure 5:
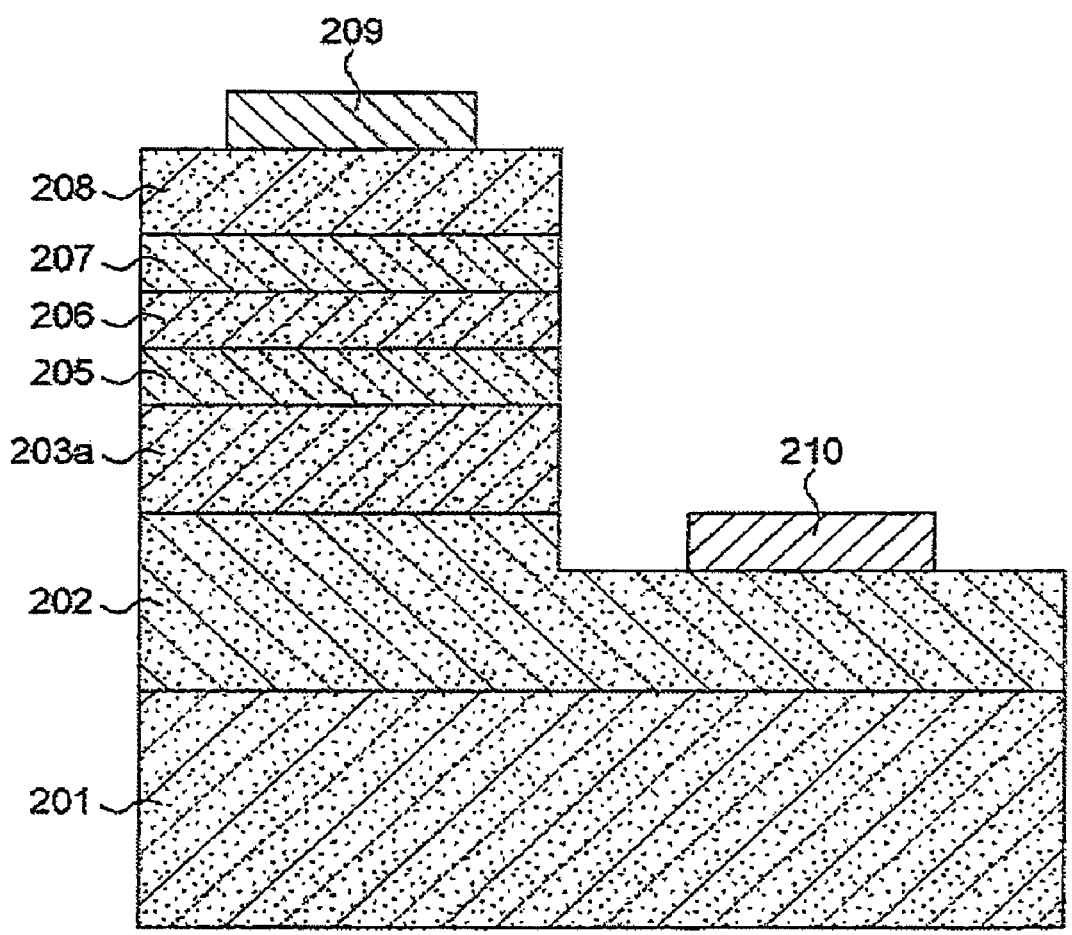
FIG. 5 is a schematic sectional view of another embodiment of the light emitting device formed on the single crystal substrate.

FIG. 3A-E illustrates the manufacturing method of the laser device which comprises the steps of forming the laser structure on A-plane of the GaN substrate shown in FIG. 5, forming the light emitting end face of the resonator on M-plane, forming the light emitting end face by cleavage after formation of ridge and electrode, covering the resonator end face other than the light emitting end face with a mask, and covering the light emitting end face with M-place end face film and then forming laser device in the form of tip by cleavage etc.

The first method shown in FIG. 2, the wafer is prepared on C-plane of GaN substrate 1 by depositing successively the n-type nitride semiconductor layer or layers 2 composed of an n-type contact layer 21, a crack-preventing layer 22, an n-type clad layer 23 and an n-type optical guide layer 24, then the active layer 3 and finally the p-type nitride semiconductor layer or layers 4 composed of a protective layer 41, a p-type optical guide layer 42, a p-type clad layer 43 and a p-type contact layer 44. (FIG. 2A) In this process, GaN substrate is used differently from the first method, which results in that n-type nitride semiconductor layer or layers 2 are not formed on the low temperature buffer layer 11 through ELO layer and the dislocation of the epitaxial layer can be decreased.

Figure 2A:
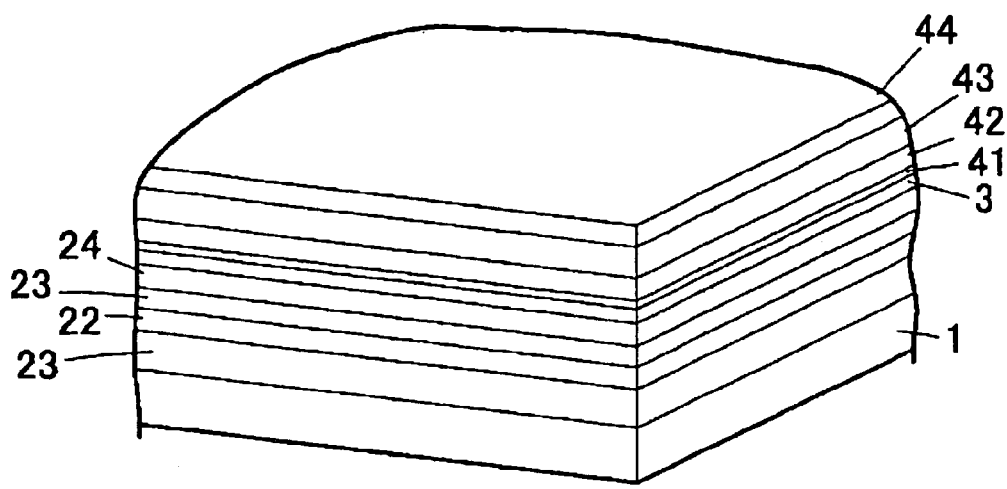
FIG. 2A-2E is a schematic sectional view illustrating a manufacturing process of the nitride semiconductor laser device, in case of the preferred embodiment according to the present invention.
Figure 2B:
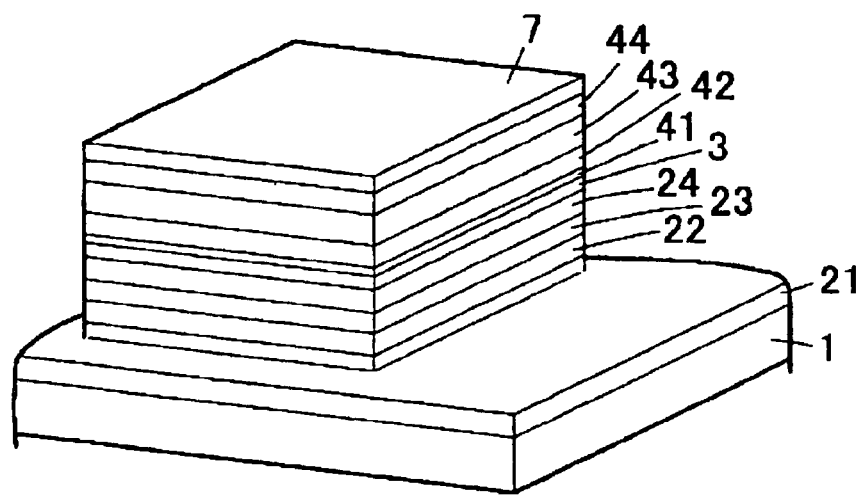
Figure 2C:
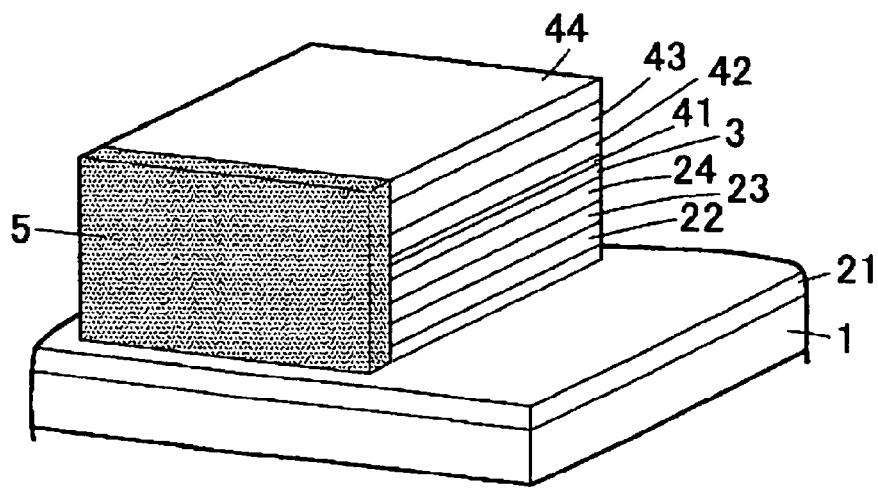
Figure 2D:
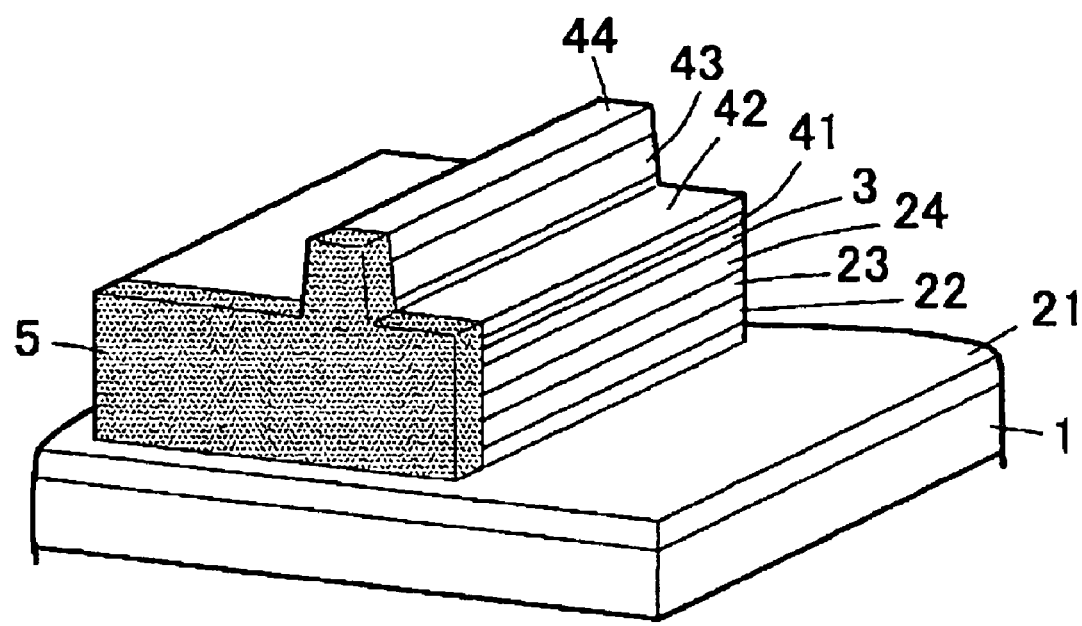

Next, the obtained wafer is subject to an etching process, as a result, the end face of the resonator and the n-type contact layer 21 are uncovered and the surface other than the light emitting end face of the resonator is covered by the mask 7(FIG. 2B). Then the end face film 5 is formed on the wafer, whose end faces of the resonator are uncovered, by applying AMMONO method. (FIG. 2C)

Next, a ridge is formed by a typical device process after the formation of the end face film and removing the mask 7. (FIG. 2D) The ridge stripe which performs the optical wave guide is formed in the direction of the resonator. The width of the ridge is from 1.0 µm to 20 µm and the ridge reaches the p-type clad layer or the p-type guide layer. Next, a buried layer 70 of $ZrO_2$ film is formed to cover the ridge. A p-type ohmic electrode 80 is formed to be in contact with the p-type contact layer 43 which is on the top surface of the ridge. Both of single ridge and plural ridges can be used. A multi-stripe-type laser device can be obtained by plural ridges.

Figure 2E:
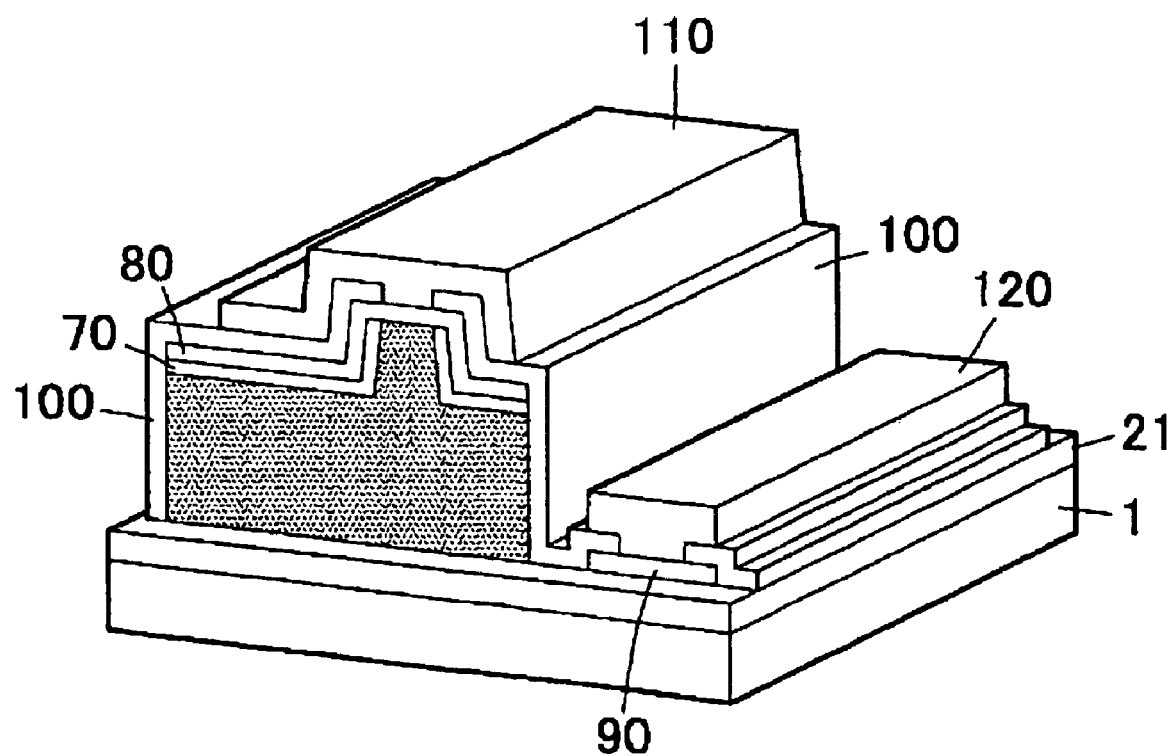

Next, an n-type electrode 90 arranged parallel to the p-type electrode is formed on the surface of the n-type contact layer 21. In further sequence, a p-type pad electrode 110 and an n-type pad electrode 120 are formed. Moreover, a $SiO_2/TiO_2$ insulating coating is formed to cover the entire device except for the surface of the p-type electrode and the n-type electrode, and due to an alternate arrangement and a patterning of the $SiO_2$ and $TiO_2$ layers it serves as the reflecting layer 100 at the moment of laser oscillation. Finally, each nitride semiconductor laser device is cut out from the wafer by scribing. In this way a finished nitride semiconductor laser device is obtained. (FIG. 2E, FIG. 1)

Moreover, the protective film can be formed on the end face film to perform an effective resonance. There is a difference of the reflective index between the protective film and the AlGaN end face film. Concretely, the protective film contains at least one element selected from the group consisting of Nb, Ni, Cr, Ti, Cu, Fe, Zr, Hf, W, Rh, Ru, Mg, Al, Sc, Y, Mo, Ta, Co, Pd, Ag, Au, Pt, Ga and the compound such as oxide, nitride and fluoride thereof.

Figure 3A:
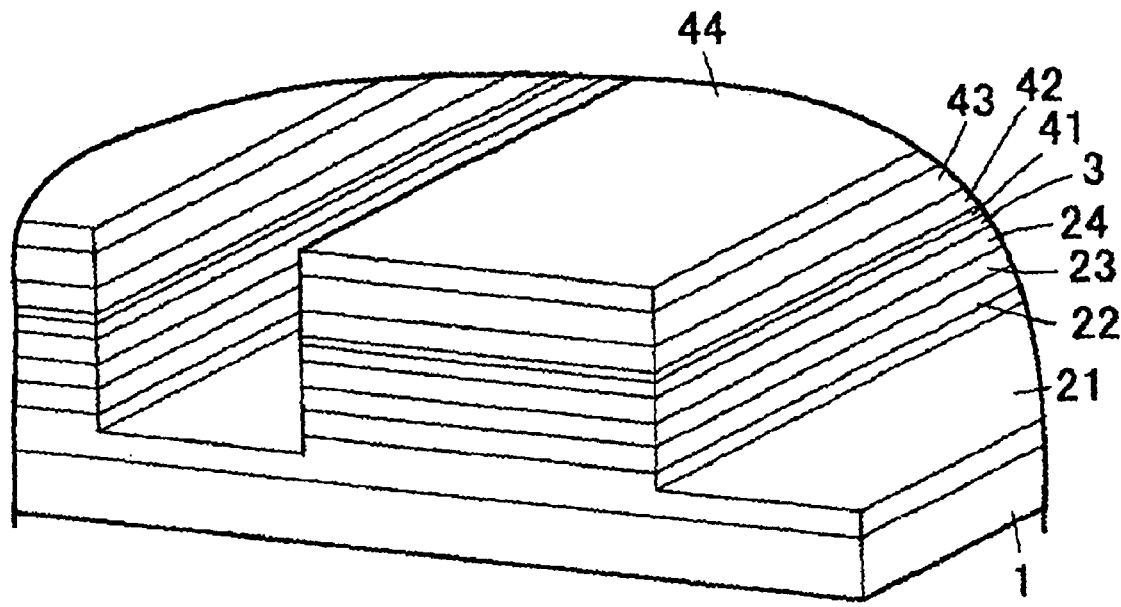
FIG. 3A-3E is illustrating a manufacturing process for the nitride semiconductor laser device by cleavage according to the present invention.
Figure 3B:
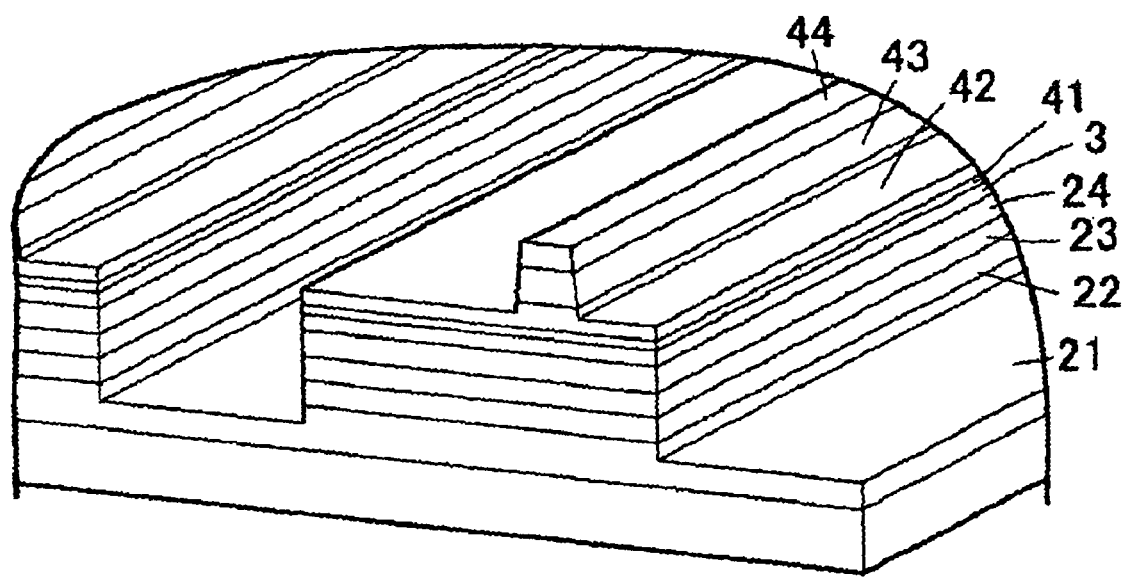
Figure 3C:
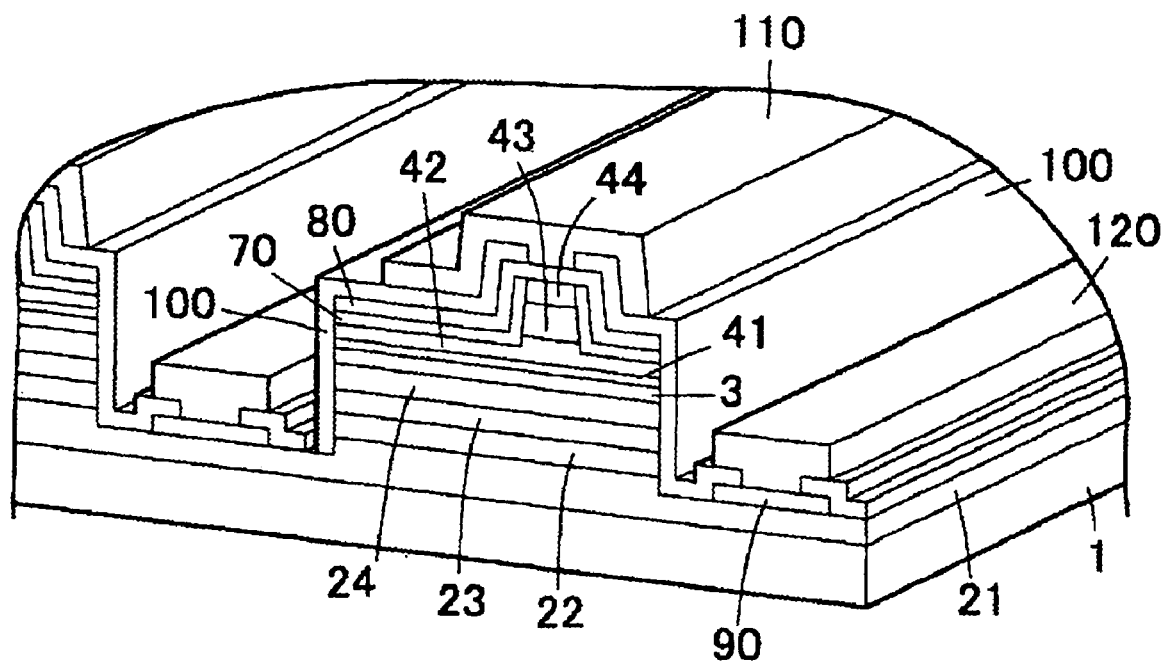
Figure 3D:
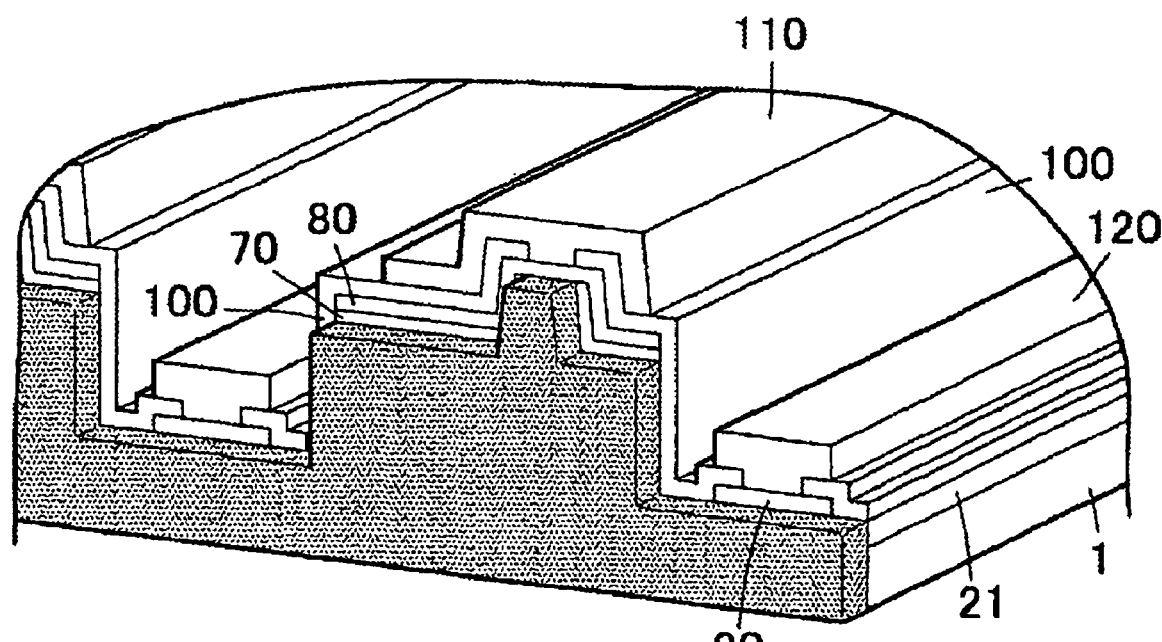
Figure 3E:
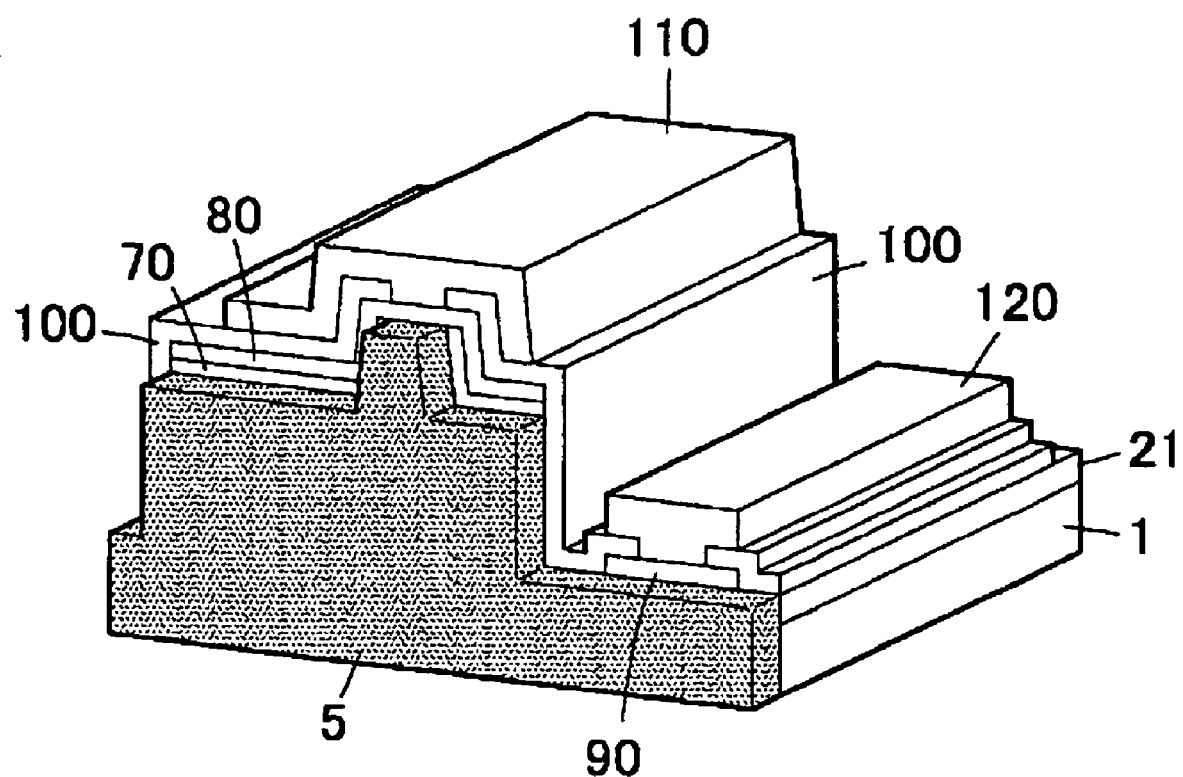

In the second method shown in FIG. 3A-E, A-plane of the GaN substrate 1 is cut out from the bulk single crystal as illustrated in FIG. 5 and used as a substrate and a light emitting end face is M-plane so that a laser device can be obtained by cleavage. A nitride semiconductor laser device is formed on the GaN substrate 1 similarly as the first method. The same reference numeral is given to the same element to omit the explanation. Next, the n-type contact layer 21 is uncovered by etching (FIG. 3A). Then a ridge is formed (FIG. 3B) and the p-type ohmic electrode 80 is formed to be in contact with the p-type contact layer 43 which is on the top surface of the ridge. Next, the n-type electrode 90 is formed on the surface of the n-type contact layer 21, and the p-type pad electrode 110 and n-type pad electrode 120 are formed. (FIG. 3C) Next, the light emitting end face is formed by cleavage so that the wafer becomes in the form of a bar. Moreover, the end face film 5 is formed in a supercritical ammonia. (FIG. 3D) The resultant wafer is subject to cleavage so that a laser device can be obtained. (FIG. 3E)

In case that the protective layer 41 is formed, the single crystal AlGaN layer can be formed at a low temperature, i.e. from 500° C. to 600° C., by applying AMMONO method. P-type nitride layer can be formed without degradation of the active layer containing In.

Figure 4:
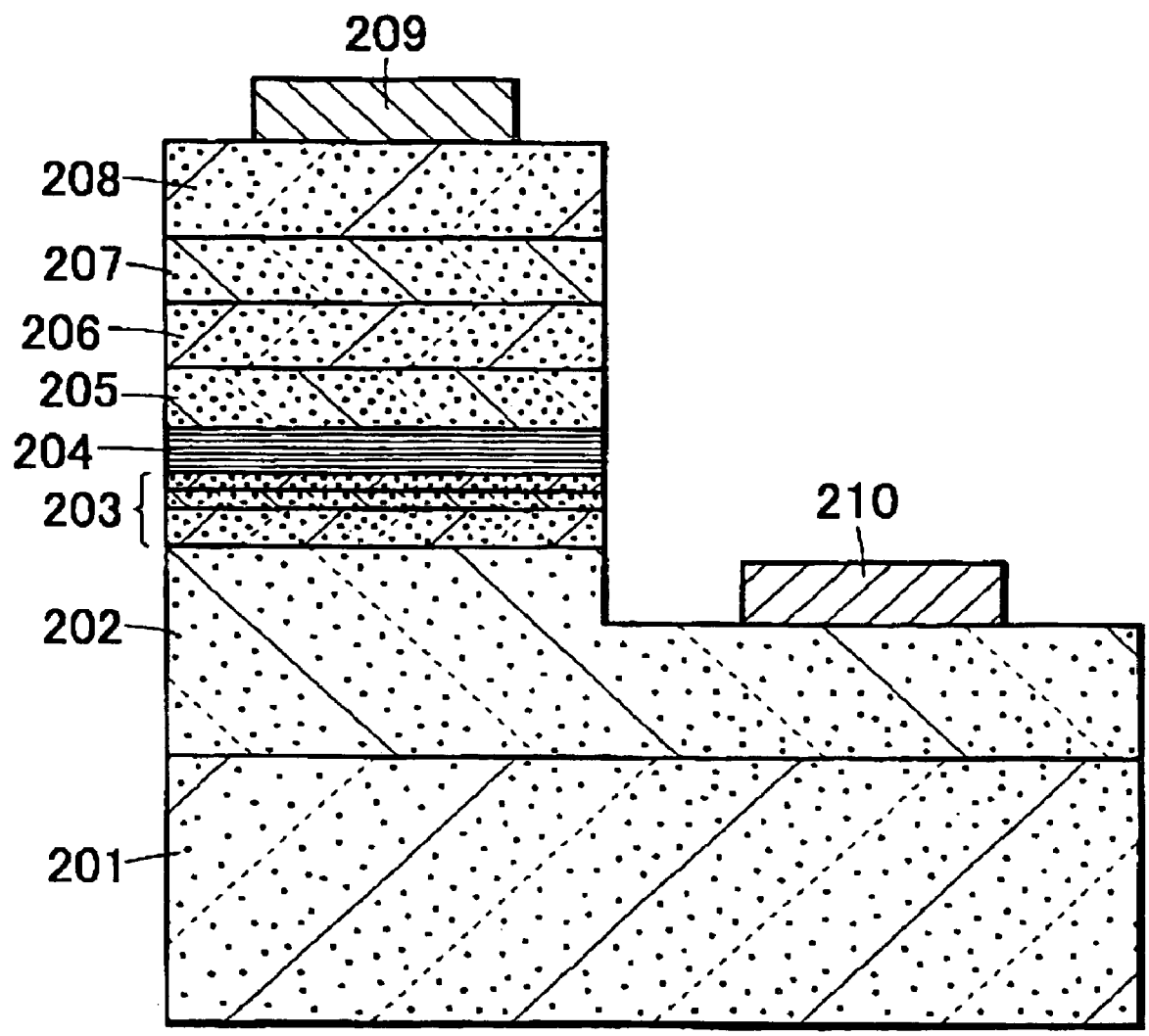
FIG. 4 is a schematic sectional view of the light emitting device formed on the single crystal substrate.

FIG. 4 illustrates the LED device formed on a GaN substrate 201 obtained by a supercritical ammonia method.

After an n-type contact layer 202 is formed directly on the GaN substrate 201 without forming the low temperature buffer layer, a modulation doped layer 203 composed of undoped GaN/Si doped GaN/undoped GaN and an active layer 205 composed of InGaN well layer/GaN barrier layer through a superlattice layer 204 are formed. LED is obtained by successively depositing a p-type clad layer 206, an undoped AlGaN layer 207 and a p-type contact layer 208 on the top surface of the active layer 205. 209 shows a p-type electrode and 210 shows an n-type electrode.

The bulk single crystal substrate according to the present invention can be used as an intermediate layer 203a instead of the modulation doped layer 203 and the superlattice layer 204, while the n-type contact layer 202 is formed on one bottom side, and the active layer 205, p-type clad layer 206, undoped AlGaN layer 207 and p-type contact layer 208 are successively deposited on top surface so that the similar layer structure can be formed. As described above, AMMONO method which enables to form the single crystal at a low temperature allows forming an intermediate layer with less crystal dislocation and simplifying the device structure.

The following examples are intended to illustrate the present invention and should not be construed as being limiting.

EXAMPLE 1

First, a GaN substrate 1 of 2 inch diameter on C-plane as a growth face is placed in a MOCVD reactor. Temperature is set at 1050° C. Hydrogen is used as a carrier gas, and ammonia and TMG (thrimethylgallium) are used as gaseous materials.

On the substrate, the following layers are deposited one after the other:

(1) 4 µm thickness n-type GaN contact layer, doped with Si at the level of $3 \times 10^{18}/cm^3$.

(2) n-type clad layer, in the form of the superlattice of the total thickness being 1.2 µm, formed by alternate deposition of 25 angstroms thickness undoped $Al_{0.1}Ga_{0.9}N$ layers and n-type GaN layers doped with Si at the level of $1 \times 10^{19}/cm^3$.

(3) 0.2 µm thickness undoped GaN p-type optical guide layer.

(4) an active layer of the total thickness being 380 angstroms in the form of layers alternately arranged, i.e. barrier layer/well layer/barrier layer/well layer/barrier layer, wherein 100 angstroms thickness with Si doped $In_{0.05}Ga_{0.95}N$ layer forms a barrier layer, and 40 angstroms thickness undoped $In_{o.1}Ga_{o.9}N$ layer forms a quantum well layer.

(5) a wafer is introduced into the reactor (autoclave) inside which is filled with a supercritical ammonia. Having been filled with the feedstock in the form of GaN of 0.5 g, ammonia of 14.7 g and mineralizer in the form of Li of 0.036 g, the autoclave (36 $cm^3$) is tightly closed at a temperature 500° C. or less inside the autoclave. The internal autoclave is divided into two zones: the higher temperature zone and the lower temperature zone. In the higher temperature zone of 550° C. there is a wafer, whereas in the lower temperature zone of 450° C. there are feedstock in the form of GaN and Ga metal. The sealed autoclave is left for three days. Under the low temperature condition, in the supercritical ammonia 100 angstrom thickness single crystal GaN protective film is grown on the GaN barrier layer of the n-type active layer.

Then the wafer is taken out from the autoclave and set in the MOCVD reactor device at a temperature of 1050° C.

(6) 0.2 µm thickness undoped GaN p-type optical guide layer.

(7) p-type clad layer in the form of the superlattice of the total thickness being 0.6 µm, formed by alternate deposition of 25 angstroms thickness undoped $Al_{0.16}Ga_{0.84}N$ layers and 25 angstroms thickness undoped GaN layers.

(8) 150 angstroms thickness p-type contact layer of p-type GaN doped with Mg at the level of $1 \times 10^{20}/cm^3$.

After the above layers are deposited, the formed wafer is subject to annealing in the MOCVD reactor device under the nitrogen atmosphere, at a temperature of 700° C., which additionally reduces resistance of the p-type nitride semiconductor layer or layers.

After annealing, the wafer is taken out from the reactor and a protective film (mask) in the form of $SiO_2$ stripe is deposited on the surface of the top p-type contact layer. Next, by using RIE method, the wafer is etched and stripe is formed, uncovering thereby end faces of the resonator and the surface of the n-type contact layer. The $SiO_2$ protective film (mask) formed on the surface of the p-type contact layer is removed by using the wet etching method.

Next, under the low temperature condition, in the supercritical ammonia 100 angstrom thickness single crystal GaN end face film is grown on the stripe end face, stripe lateral face and uncovered surfaces of the n-type contact layer and p-type contact layer.

After a single crystal GaN end face film is formed, the single crystal GaN formed on the surface of the top p-type contact layer is removed by etching. Next, the surface of the p-type contact layer is covered with the $SiO_2$ mask in the form of 1.5 µm wide strips and etching of the p-type clad layer is continued until ridge is formed on the strip part. Etching is carried out until thickness of the p-type clad layer becomes 0.1 µm on both sides of ridge.

In this way a ridge part of 1.5 µm width is formed.

Next, by use of the ion sputtering method, a 0.5 µm thickness $ZrO_2$ film is formed so that it would cover stripe surfaces over the $Sio_2$ mask.

After the thermal processing, the buried layer 70 in the form of the $ZrO_2$ film is deposited on the top stripe surface, on the lateral face of ridge and on the surface of the p-type clad layer located on both sides of ridge. This $ZrO_2$ film allows stabilizing a lateral mode at the moment of laser oscillation.

Next the p-type electrode 80 in the form of Ni/Au is formed on the p-type contact layer so that an ohmic contact would appear, and the n-type electrode 90 in the form of Ti/Al on the n-type contact layer. Then, the wafer is subject to the thermal processing at a temperature of 600° C. Next, pad electrode in the form of Ni(1000Å)-Ti(1000Å)-Au(8000Å) are laid on the p-type and n-type electrode. After a reflecting film 100 in the form of $Sio_2$ and $TiO_2$ is formed, each nitride semiconductor laser device is cut out from the wafer by scribing.

Each nitride semiconductor laser device manufactured in this way is equipped with a heat sink and the laser oscillation is carried out. Due to an increase of a COD level, prolonged continuous oscillation time is expected—with threshold current density: 2.0 $kA/cm^2$, power output: 100 mW, preferably 200 mW, and 405 nm oscillation wavelength.

EXAMPLE 2

A single crystal GaN end face film of 1 µm thickness is grown on the only one light emitting end face on the stripe part, whereas other stages of production of the nitride semiconductor laser device are carried out similarly as in Example 1.

Each laser device manufactured in this way is equipped with a heat sink and the laser oscillation is carried out. Prolonged laser lifetime in continuous oscillation mode is expected—with threshold current density: 2.0 kA/cm², power output: 100 mW and 405 nm oscillation wavelength—similar as in Example 1.

EXAMPLE 3

A SiO₂ protective film in the form of lattice pattern is deposited on the surface of the top p-type contact layer. Next, etching of RIE method is carried out so as to uncover an end face of a resonator and the surface of the n-type contact layer. Under the condition of the SiO₂ mask of 0.5 μm thickness formed on the surface of the p-type contact layer, the wafer is introduced into the reactor (autoclave) inside which is filled with a supercritical ammonia. In other respects, production of the nitride semiconductor laser device is carried out similarly as in Example 1.

Each laser device manufactured in this way is equipped with a heat sink and laser oscillation is carried out. Prolonged laser lifetime in continuous oscillation mode is expected—with threshold current density: 2.0 kA/cm², power output: 100 mW and 405 nm oscillation wavelength—similarly as in Example 1.

INDUSTRIAL APPLICABILITY

As described above, a bulk single crystal substrate by the supercritical ammonia can be used to form nitride semiconductor light emitting devices according to the present invention so that an efficient laser device can be obtained to form a laser device on the substrate having less crystal dislocation causing non-radiative recombination.

Moreover, non-polar nitride A-plane or non-polar nitride M-plane can be cut out from the bulk single crystal so that the laser device can be formed on the A-plane or M-plane as an epitaxial growth face. For this, there can be obtained the laser device wherein the active layer is not influenced by the polarization and there is no cause of the deterioration of the performance such as the red shift of light emitting, recombination degradation and increase of the threshold current.

Furthermore the bulk single crystal layer with less crystal dislocation can be used as an intermediate layer, which enables to simplify the light emitting device structure for the laser device.

Moreover, the nitride layer can be formed in the form of single crystal at a low temperature so that the active layer containing In is not influenced by degradation or damaged. Therefore the function and lifetime of the device can be improved.

The invention claimed is:

1. A light emitting device structure comprising a gallium-containing nitride substrate, an n-type gallium-containing nitride semiconductor layer or layers, a gallium-containing nitride semiconductor active layer, a p-type gallium-containing nitride semiconductor layer or layers formed on said substrate by a vapor phase growth, and either an undoped GaN, AlN or AlGaN intermediate layer formed between the n-type gallium-containing nitride semiconductor layer or layers and the gallium-containing nitride semiconductor active layer or an AlxGa1-xN protective layer, wherein $0 \leq x \leq 1$, formed on the gallium-containing nitride semiconductor active layer,
wherein said substrate is obtained from a gallium-containing nitride bulk single crystal prepared by a supercritical ammonia method, the substrate is provided with an epitaxial growth face of A-plane with a dislocation density of $10^5/cm^2$ or less and comprises an alkali metal element, said light emitting device is a semiconductor laser device and is formed on said A-plane of the bulk single crystal GaN substrate, and a light emitting face of a resonator of the light emitting device is M-plane, on which an end face film is formed, and
wherein the intermediate layer or the protective layer is formed by a supercritical ammonia method at 600° C. or less and comprises an alkali metal element.

2. A light emitting device structure comprising a gallium-containing nitride substrate, an n-type gallium-containing nitride semiconductor layer or layers, a gallium-containing nitride semiconductor active layer, a p-type gallium-containing nitride semiconductor layer or layers formed on said substrate by a vapor phase growth, and either an undoped GaN, AlN or AlGaN intermediate layer formed between the n-type gallium-containing nitride semiconductor layer or layers and the gallium-containing nitride semiconductor active layer or an AlxGa1-xN protective layer, wherein $0 \leq x \leq 1$, formed on the gallium-containing nitride semiconductor active layer,
wherein said substrate is obtained from a gallium-containing nitride bulk single crystal prepared by a supercritical ammonia method,
the intermediate layer or the protective layer is formed by a supercritical ammonia method at 600° C. or less and comprises an alkali metal element,
said substrate is provided with an epitaxial growth face of A-plane with a dislocation density of $10^5/cm^2$ or less and comprises an alkali metal element,
said light emitting device is a semiconductor laser device and formed on A-plane of the bulk single crystal GaN substrate, a light emitting face of a resonator of the light emitting device is M-plane, on which an end face film is formed, and
said n-type semiconductor layer or layers are formed directly or through an AlGaN layer on said A-plane of the substrate.

3. The light emitting device structure according to claim 1 or 2, wherein said substrate is a composite substrate in which a gallium-containing nitride is grown on a heterogeneous substrate by a supercritical ammonia method.

4. The light emitting device structure according to claim 3, wherein a GaN, AlN or AlGaN layer is preformed on the heterogeneous substrate and then a gallium-containing nitride bulk single crystal is formed thereon by a supercritical ammonia method.

5. A light emitting device structure comprising an n-type gallium-containing nitride semiconductor layer or layers, a gallium-containing nitride semiconductor active layer, a p-type gallium-containing nitride semiconductor layer or layers prepared by a vapor phase growth, and either an undoped GaN, AlN or AlGaN intermediate layer formed between the n-type gallium-containing nitride semiconductor layer or layers and the gallium-containing nitride semiconductor active layer or an AlxGa1-xN protective layer, wherein $0 \leq x \leq 1$, formed on the gallium-containing nitride semiconductor active layer,
wherein the intermediate layer or the protective layer is formed by a supercritical ammonia method at 600° C. or less and comprises an alkali metal element,
wherein an undoped layer of said n-type gallium-containing nitride semiconductor layers has A-plane for crystal growth and is obtained from a bulk single crystal prepared by a supercritical ammonia; the substrate comprises an alkali metal element; the A-plane of the undoped layer is provided with an epitaxial growth face with a dislocation density of $10^5/cm^2$ or less; said light emitting device is a semiconductor laser device and is formed on the A-plane of the bulk single crystal GaN substrate; and a light emitting face of a resonator of the light emitting device is M-plane, on which an end face film is formed, wherein at least an n-type nitride semiconductor layer or layers containing n-type impurities are formed on one face of growth faces, and wherein said nitride active layer and said p-type nitride semiconductor layer or layers are formed directly or through an n-type nitride semiconductor layer or layers on the other face of said growth faces.

6. A light emitting device structure comprising a gallium-containing nitride substrate, an n-type gallium-containing nitride semiconductor layer, a gallium-containing nitride semiconductor active layer, a p-type gallium-containing nitride semiconductor layer on said substrate, and either an undoped GaN, AlN or AlGaN intermediate layer formed between the n-type gallium-containing nitride semiconductor layer or layers and the gallium-containing nitride semiconductor active layer or an $Al_xGa_{1-x}N$ protective layer, wherein $0 \leq x \leq 1$, formed on the gallium-containing nitride semiconductor active layer, wherein said substrate is a piece of a gallium-containing nitride bulk single crystal, has an epitaxial growth face of A-plane with a dislocation density of $10^5/cm^2$ or less and comprises an alkali metal element, the intermediate layer or the protective layer is formed by a supercritical ammonia method at 600° C. or less and comprises an alkali metal element, said light emitting device is a semiconductor laser device and is formed on said A-plane of the bulk single crystal GaN substrate, and a light emitting face of a resonator of the light emitting device is M-plane, on which an end face film is formed.

7. A light emitting device structure comprising a gallium-containing nitride substrate, an n-type gallium-containing nitride semiconductor layer or layers, a gallium-containing nitride semiconductor active layer, a p-type gallium-containing nitride semiconductor layer or layers on said substrate, and either an undoped GaN, AlN or AlGaN intermediate layer formed between the n-type gallium-containing nitride semiconductor layer or layers and the gallium-containing nitride semiconductor active layer or an $Al_xGa_{1-x}N$ protective layer, wherein $0 \leq x \leq 1$, formed on the gallium-containing nitride semiconductor active layer, wherein said substrate is a piece of a gallium-containing nitride bulk single crystal, has an epitaxial growth face of A-plane with a dislocation density of $10^5/cm^2$ or less and comprises an alkali metal element, the intermediate layer or the protective layer is formed by a supercritical ammonia method at 600° C. or less and comprises an alkali metal element, said light emitting device is a semiconductor laser device and formed on said A-plane of the bulk single crystal GaN substrate, a light emitting face of a resonator of the light emitting device is M-plane, on which an end face film is formed, and said n-type semiconductor layer is formed directly or through an AlGaN layer on said A-plane of the substrate.

* * * * *

UNITED STATES PATENT AND TRADEMARK OFFICE
CERTIFICATE OF CORRECTION

PATENT NO. : 7,750,355 B2
APPLICATION NO. : 10/493594
DATED : July 6, 2010
INVENTOR(S) : Robert Dwilinski et al.

It is certified that error appears in the above-identified patent and that said Letters Patent is hereby corrected as shown below:

In Claim 1, column 13, line 59, please replace "Al xGa1-xN" with --$Al_xGa_{1-x}N$--.

In Claim 2, column 14, line 17, please replace "Al xGa1-xN" with --$Al_xGa_{1-x}N$--.

In Claim 5, column 14, line 54, please replace "Al xGa1-xN" with --$AlxGa_{1-x}N$--.

In Claim 6, column 15, line 22, please replace "Al xGa1-xN" with --$AlxGa_{1-x}N$--.

In Claim 7, column 16, line 14, please replace "Al xGa1-xN" with --$AlxGa_{1-x}N$--.

Signed and Sealed this

Fourteenth Day of September, 2010

David J. Kappos
*Director of the United States Patent and Trademark Office*